United States Patent
Jeon et al.

(10) Patent No.: US 8,168,521 B2
(45) Date of Patent: May 1, 2012

(54) METHODS OF MANUFACTURING SEMICONDUCTOR DEVICES HAVING LOW RESISTANCE BURIED GATE STRUCTURES

(75) Inventors: In-Sang Jeon, Gyeonggi-do (KR);
Si-Hyung Lee, Gyeonggi-do (KR);
Jong-Ryeol Yoo, Gyeonggi-do (KR);
Yu-Ghun Shin, Gyeonggi-do (KR);
Suk-Hun Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/725,743

(22) Filed: Mar. 17, 2010

(65) Prior Publication Data

US 2010/0240180 A1    Sep. 23, 2010

(30) Foreign Application Priority Data

Mar. 17, 2009   (KR) .................. 10-2009-0022597

(51) Int. Cl.
*H01L 21/3205* (2006.01)
*H01L 21/4763* (2006.01)

(52) U.S. Cl. ............... 438/589; 438/272; 257/E21.621; 257/E21.635

(58) Field of Classification Search .............. 438/272, 438/799, 589; 257/E21.475, E21.635, E21.621
See application file for complete search history.

(56) References Cited

U.S. PATENT DOCUMENTS

| | | | |
|---|---|---|---|
| 5,484,747 A * | 1/1996 | Chien | 438/644 |
| 5,599,739 A * | 2/1997 | Merchant et al. | 438/628 |
| 6,607,979 B1 * | 8/2003 | Kamiyama | 438/653 |
| 2003/0059980 A1 * | 3/2003 | Chen et al. | 438/118 |
| 2005/0212139 A1 * | 9/2005 | Leinikka et al. | 257/762 |
| 2008/0042118 A1 * | 2/2008 | Hayakawa | 257/4 |
| 2008/0061322 A1 * | 3/2008 | von Kluge | 257/213 |

FOREIGN PATENT DOCUMENTS

| | | |
|---|---|---|
| JP | 2003-158092 | 5/2003 |
| KR | 10-0668851 | 1/2007 |
| KR | 10-0855967 | 8/2008 |

* cited by examiner

*Primary Examiner* — Caridad Everhart
(74) *Attorney, Agent, or Firm* — Myers Bigel Sibley & Sajovec

(57) ABSTRACT

In a method of manufacturing a semiconductor device, a recess is formed in an active region of a substrate. A gate insulation layer is formed in the first recess. A barrier layer is formed on the gate insulation layer. A preliminary nucleation layer having a first resistance is formed on the barrier layer. The preliminary nucleation layer is converted into a nucleation layer having a second resistance substantially smaller than the first resistance. A conductive layer is formed on the nucleation layer. The conductive layer, the nucleation layer, the barrier layer and the gate insulation layer are partially etched to form a buried gate structure including a gate insulation layer pattern, a barrier layer pattern, a nucleation layer pattern and a conductive layer pattern.

12 Claims, 19 Drawing Sheets

80 65 75 70 60

545 520 536 534 526

I  II 545 520 536 534 526 565  566 560 555 566

I  II

METHODS OF MANUFACTURING SEMICONDUCTOR DEVICES HAVING LOW RESISTANCE BURIED GATE STRUCTURES

CROSS REFERENCE TO RELATED APPLICATION

This application claims priority under 35 U.S.C. §119 to Korean Patent Application No. 2009-22597, filed on Mar. 17, 2009, the disclosure of which is hereby incorporated by reference herein in its entirety.

BACKGROUND

Example embodiments relate to semiconductor devices and, more particularly, to semiconductor devices that include low resistance buried gate structures and to related methods of manufacturing such devices, As semiconductor devices become more highly integrated, the size of each unit cell of the devices and the widths of the patterns is decreased. Moreover, while the size of each unit cell is decreased, the electrical characteristics of the device typically must be maintained or improved. Accordingly, the integration density is often increased by stacking elements vertically relative to a substrate. For example, a transistor including a buried gate electrode has been developed that may exhibit both enhanced electrical characteristics and a high degree of integration.

Generally, the conventional buried gate structure is formed in a recess that is provided on a substrate. The conventional buried gate structure includes a gate dielectric layer pattern, a metal barrier layer pattern, a gate electrode and a gate mask. The gate dielectric layer pattern is formed on a bottom and a sidewall of the recess. The metal barrier layer pattern and the gate electrode are formed on the gate dielectric layer pattern. Each of the metal barrier layer pattern and the gate electrode has a height that is smaller than a height of the gate dielectric layer pattern. The gate mask is located on the metal barrier layer pattern and the gate electrode to fill the recess.

In the conventional buried gate structure, the gate electrode may not be properly formed on the metal barrier layer pattern, and the gate electrode may not have a low resistance when the gate electrode is directly formed on the metal barrier layer pattern. When the gate electrode includes tungsten (W), the gate electrode formed on the metal barrier layer pattern may have an α crystalline phase that has a resistance that is smaller than a resistance of a β crystalline phase. When the gate electrode includes tungsten of the β crystalline phase, the gate electrode may have a relatively large specific resistance, and thus the buried gate structure may also have an increased resistance. If the buried gate structure has a large resistance, the semiconductor device may have poor electrical characteristics. This may cause a number of problems, particularly with respect to semiconductor devices that have a design rule below about 20 nm.

SUMMARY

Example embodiments provide a semiconductor device that includes a buried gate structure having a low resistance that has a low resistance nucleation layer.

Example embodiments provide a method of manufacturing a semiconductor device that includes a buried gate structure that has a low resistance using a low resistance nucleation layer.

According to one aspect of example embodiments, there is provided a method of manufacturing a semiconductor device. Pursuant to this method, a first recess is formed in an active region of a substrate. A gate insulation layer is formed on a bottom and a sidewall of the first recess. A barrier layer is formed on the gate insulation layer. A preliminary nucleation layer having a first resistance is formed on the barrier layer. The preliminary nucleation layer is converted to a nucleation layer having a second resistance that is substantially smaller than the first resistance. A conductive layer is formed on the nucleation layer. A buried gate structure is formed in the first recess by partially etching the conductive layer, the nucleation layer, the barrier layer and the gate insulation layer. The buried gate structure includes a gate insulation layer pattern, a barrier layer pattern, a nucleation layer pattern and a conductive layer pattern.

In example embodiments, the barrier layer may include metal and/or metal compound.

In example embodiments, the preliminary nucleation layer may include a metal and the nucleation layer may be formed by thermally treating the preliminary nucleation layer. For example, the preliminary nucleation layer may be formed using tungsten, molybdenum, manganese, chrome, ruthenium, iridium, etc. The preliminary nucleation layer and the nucleation layer may be formed using different apparatuses, Alternatively, the preliminary nucleation layer and the nucleation layer may be formed in-situ using a single apparatus.

In example embodiments, the nucleation layer may be formed by a rapid thermal annealing process, a spike rapid thermal annealing process, a flash rapid thermal annealing process, a laser annealing process, a millisecond annealing process, etc. The nucleation layer may be formed by treating the preliminary nucleation layer at a temperature of about 700° C. to about 1,500° C. Impurities in the preliminary nucleation layer may be removed by thermally treating the preliminary nucleation layer to form the nucleation layer, In example embodiments, the preliminary nucleation layer may include tungsten having a β crystalline phase and the nucleation layer may include tungsten having an α crystalline phase.

In example embodiments, portions of the gate insulation layer, the barrier layer, the nucleation layer and the conductive layer may be partially etched to expose the substrate, so that the gate insulation layer pattern may be formed on the bottom and the sidewall of the first recess. Portions of the barrier layer, the nucleation layer and the conductive layer may be further etched to form the barrier layer pattern, the nucleation layer pattern and the conductive layer pattern on the gate insulation layer pattern. A second recess may be generated on the buried gate structure. A gate mask may be formed on the barrier layer pattern, the nucleation layer pattern and the conductive layer pattern to fill the second recess.

In example embodiments, an isolation layer may be formed on the substrate to define the active region of the substrate. An impurity region may be formed at a portion of the active region adjacent to the buried gate structure. An insulating interlayer may be formed on the substrate to cover the buried gate structure. A capacitor may be provided on the insulating interlayer. The capacitor may be electrically connected to the impurity region.

According to another aspect of example embodiments, a semiconductor device is provided that includes a substrate, a gate insulation layer pattern, a barrier layer pattern, a nucleation layer pattern, a conductive layer pattern and a gate mask. The substrate includes an active region having a recess. The gate insulation layer pattern is on a bottom and a sidewall of the first recess. The barrier layer pattern is on the gate insulation layer pattern. The nucleation layer pattern is on the barrier layer pattern. The nucleation layer pattern may be formed from a preliminary nucleation layer that has a first resistance that is substantially smaller than a second resistance of the nucleation layer pattern. The conductive layer pattern is on the nucleation layer pattern. The gate mask is on the conductive layer pattern and may fill the recess.

In example embodiments, the preliminary nucleation layer may comprise a metal. For example, the preliminary nucleation layer may comprise tungsten having a β crystalline phase and the nucleation layer pattern may comprise tungsten having an α crystalline phase.

In example embodiments, the nucleation layer pattern may be formed from the preliminary nucleation layer by a thermal treatment process.

In example embodiments, the semiconductor device may additionally include an impurity region, an insulating interlayer and a capacitor. The impurity region may be disposed at a portion of the active region that is adjacent to the buried gate structure. The insulating interlayer may be on the substrate to cover the buried gate structure. The capacitor may be disposed on the insulating interlayer and may be electrically connected with the impurity region. The semiconductor device may further include a transistor in a peripheral circuit area of the substrate that may surround a cell area of the substrate that includes the active region. The transistor may have a channel region generated along a direction that is substantially parallel to the substrate.

According to example embodiments, the buried gate structure may have a low resistance because the conductive layer pattern may have a desired low specific resistance when the conductive layer pattern is formed using the nucleation layer that is generated from the preliminary nucleation layer through a thermal treatment process. Therefore, the semiconductor device may have enhanced electrical and operational characteristics while maintaining a minute design rule of the semiconductor device when the semiconductor device includes the buried gate structure.

BRIEF DESCRIPTION OF THE DRAWINGS

Example embodiments can be understood in more detail from the following description taken in conjunction with the accompanying drawings, in which.

DETAILED DESCRIPTION

Figure 1:
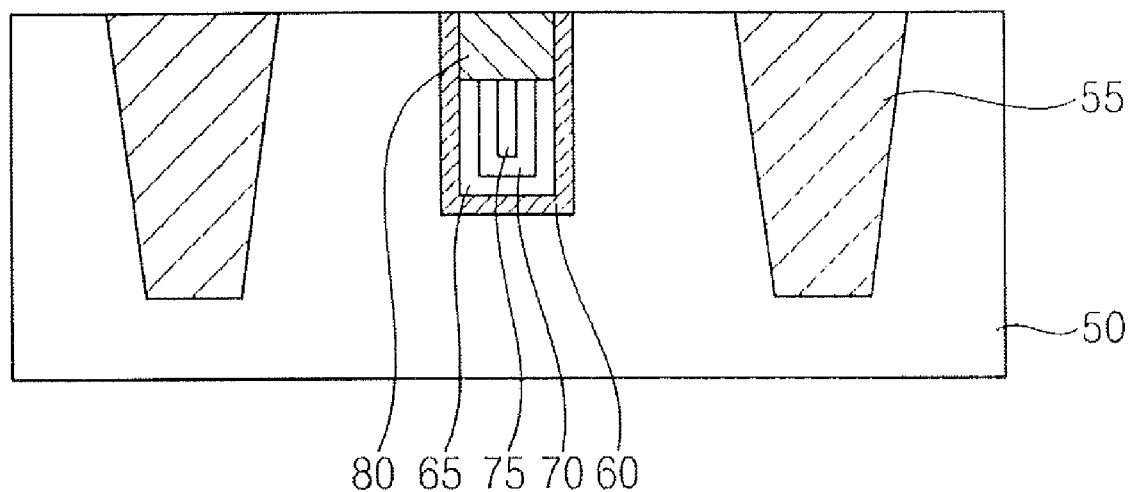
FIG. 1 is a cross sectional view illustrating a buried gate structure in accordance with example embodiments.

Example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross sectional view illustrating a buried gate structure in accordance with example embodiments.

Referring to FIG. 1, the buried gate structure includes a gate insulation layer pattern 60, a barrier layer pattern 65, a nucleation layer pattern 70, a conductive layer pattern 75 and a gate mask 80.

The buried gate structure may be buried in an active region of a substrate 50. The substrate 50 may comprise, for example, a semiconductor substrate or a substrate having a semiconductor layer thereon. An isolation layer 55 may be formed on the substrate 50 to define the active region of the substrate 50. The isolation layer 55 may include oxide such as silicon oxide. The buried gate structure may be formed in a recess provided in the active region. The recess may be formed by partially etching the substrate 50.

The gate insulation layer pattern 60 is disposed on a bottom and a sidewall of the recess. The gate insulation layer pattern 60 may include, for example, silicon oxide and/or metal oxide. The barrier layer pattern 65, the nucleation layer pattern 70 and the conductive layer pattern 75 are sequentially disposed on the gate insulation layer pattern 60 to partially fill up the recess. A gate mask may be disposed on the barrier layer pattern 65, the nucleation layer pattern 70 and the conductive layer pattern 75. The gate mask 80 may fill the remainder of the recess.

The barrier layer pattern 65 may comprise, for example, metal and/or metal compound. The barrier layer pattern 65 may prevent metal and/or metal ions in the buried gate structure from diffusing toward the active region of the substrate 50.

The nucleation layer pattern 70 may comprise, for example, metal that has a relatively low resistance. In example embodiments, the nucleation layer pattern 70 may include tungsten having an $\alpha$ crystalline phase. This nucleation layer pattern 70 may be generated from a preliminary nucleation layer (not illustrated) that includes tungsten having a $\beta$ crystalline phase. In some embodiments, the nucleation layer pattern 70 may be obtained by thermally treating such a preliminary nucleation layer.

The conductive layer pattern 75 may include metal generated from the nucleation layer pattern 70. That is, the conductive layer pattern 75 may grow from the nucleation layer pattern 70. When the nucleation layer pattern 70 includes tungsten of the a crystalline phase, the conductive layer pattern 75 may also include tungsten having an a crystalline phase. The buried gate structure including the conductive layer pattern 75 may have a low resistance that may facilitate providing semiconductor devices that have improved electrical and/or operational characteristics.

The gate mask 80 is disposed on the barrier layer pattern 65, the nucleation layer pattern 70 and the conductive layer pattern 75, and may completely fill the remainder of the recess. The gate mask 80 may comprise a material having an etching selectivity with respect to the substrate 50, the barrier layer pattern 65, the nucleation layer pattern 70 and the conductive layer pattern 75. For example, the gate mask 80 may include oxide, nitride, oxynitride, etc.

FIGS. 2 to 8 are cross sectional views illustrating a method of a buried gate structure in accordance with example embodiments.

Figure 2:
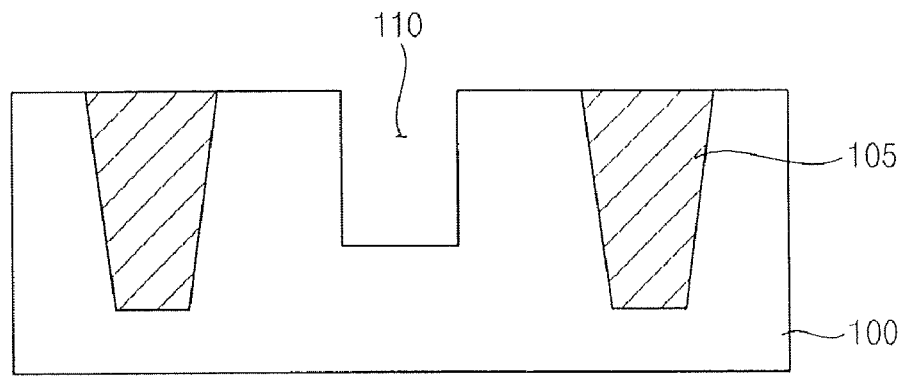
FIGS. 2 to 8 are cross sectional views illustrating a method of forming a buried gate structure in accordance with example embodiments.

Referring to FIG. 2, an isolation layer 105 is formed on a substrate 100 to define an active region and an isolation region of the substrate 100. The substrate 100 may comprise, for example, a semiconductor substrate or a substrate having a semiconductor layer thereon. For example, the substrate 100 may comprise a silicon (Si) substrate, a germanium (Ge) substrate, a silicon-germanium (Si—Ge) substrate, a silicon-on-insulator (SOI) substrate, a germanium-on-insulator (GOI) substrate, etc. The isolation region may surround the active region. A portion of the substrate 100 where the isolation layer 105 is located may correspond to the isolation region.

The isolation layer 105 may be formed using an oxide such as silicon oxide. For example, the isolation layer 105 may comprise undoped silicate (USG), spin on glass (SOG), phosphor silicate glass (PSG), boro-phosphor silicate glass (BPSG), flowable oxide (FOX), Tonen Silazene (TOSZ), fluoro silicate glass (FSG), tetraethyl orthosilicate (TEOS), plasma enhanced-TEOS (PE-TEOS), high density plasma-chemical vapor deposition (HDP-CVD) oxide, etc. The isolation layer 105 may be formed by a CVD process, a thermal oxidation process, a spin coating process, a plasma enhanced chemical vapor deposition (PECVD) process, an HDP-CVD process, etc.

In example embodiments, the isolation layer 105 may be formed by an isolation process such as, for example, a shallow trench isolation (STI) process. In the isolation process, a trench may be formed on the substrate 100 by partially etching the substrate 100. The trench may be formed, for example, by a photolithography process or an etching process using a mask. An oxide layer may be formed on the substrate 100 to fill the trench. Here, a sidewall oxide layer may be formed on a sidewall of the trench to cure etching damage to the substrate 100 generated in the process for forming the trench. The sidewall oxide layer may be obtained by a thermal oxidation process. Further, a liner nitride layer may be provided on the sidewall oxide layer or the sidewall of the trench. The liner nitride layer may be formed using silicon nitride. The oxide layer may be partially removed to expose the substrate 100, thereby forming the isolation layer 105 in the trench. The oxide layer may be partially removed by, for example, a chemical mechanical polishing (CMP) process and/or an etch-back process.

Referring now to FIG. 2, a pad oxide layer (not illustrated) and a hard mask layer (not illustrated) may be formed on the substrate 100 having the isolation layer 105. The pad oxide layer may be formed using silicon oxide by a CVD process, a PECVD process, a low pressure chemical vapor deposition (LPCVD) process, an HDP-CVD process, etc. The hard mask layer may comprise a material that has an etching selectivity relative to the substrate 100 and the pad oxide layer. For example, the hard mask layer may be formed using nitride such as silicon nitride or an oxynitride such as silicon oxynitride. Additionally, the hard mask layer may be formed by a CVD process, a PECVD process, an LPCVD process, etc. The pad oxide layer may reduce a stress generated between the substrate 100 and the mask layer.

In example embodiments, the hard mask layer may have a multi-layer structure. For example, the hard mask layer may include an oxide film, an organic material film and an anti-reflective film. The oxide film may comprise, for example, silicon oxide formed by a PECVD process or an HDP-CVD process. The oxide film may have a thickness of, for example, about 2,000 Å to about 3,000 Å. The organic material film may comprise, for example, amorphous carbon obtained by a CVD process. The organic material film may have a thickness of, for example, about 2,000 Å to about 3,000 Å. The anti-reflective film may comprise, for example, silicon nitride formed by a CVD process or a PECVD process. The anti-reflective film may have a thickness of, for example, about 300 Å to about 800 Å.

The hard mask layer and the pad oxide layer are patterned to form a hard mask (not illustrated) and a pad oxide layer pattern (not illustrated) on the substrate 100. Using the hard mask and the pad oxide layer pattern, a portion of the active region of the substrate 100 is etched to form a first recess 110 in the active region. The first recess 110 may be formed, for example, by an anisotropic etching process.

In some example embodiments, the first recess 110 may have a rounded lower portion that has a width that is substantially larger than a width of an upper portion thereof. The lower portion of the first recess 110 may have, for example, a circular cross section, a polygonal cross section, an elliptical cross section, etc. The rounded lower portion of the first recess 110 may be formed by an isotropic etching process after forming the first recess 110 on the substrate 100 by the anisotropic etching process. When the first recess 110 has the rounded lower portion, the buried gate structure may have an enlarged lower portion to enhance a channel length of a device including the buried gate structure.

After forming the first recess 110 on the substrate 100, the hard mask and the pad oxide layer pattern are removed from the substrate 100, such that the resultant structure illustrated in FIG. 2 may be obtained. The substrate 100 having the first recess 110 may be treated by a cleaning process to remove residues and/or a native oxide film from the substrate 100.

Figure 3:
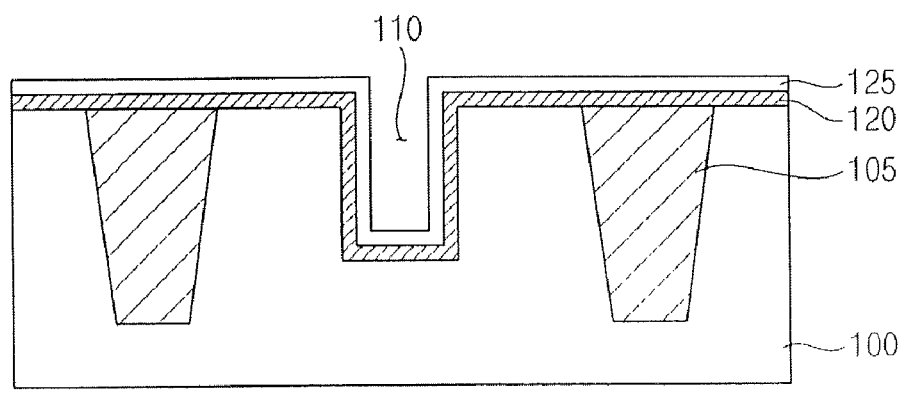

Referring to FIG. 3, a gate insulation layer 120 is formed in the first recess 110 and on the substrate 100. The gate insulation layer 120 may be conformally formed on a bottom and a sidewall of the first recess 110. That is, the gate insulation layer 120 may have a uniform thickness from the bottom and the sidewall of the first recess 110. The gate insulation layer 120 may comprise, for example, an oxide and/or a metal oxide. For example, the gate insulation layer 120 may include silicon oxide, hafnium oxide (HfOx), titanium oxide (TiOx), aluminum oxide (AlOx), tantalum oxide (TaOx), zirconium oxide (ZrOx), etc. These may be used alone or in a combination thereof. The gate insulation layer 120 may be formed by a CVD process, a sputtering process, an evaporation process, an atomic layer deposition (ALD) process, a pulsed laser deposition (PLD) process, etc.

In some example embodiments, the gate insulation layer 120 may have a multi-layer structure that includes at least one oxide film and/or at least one nitride film. For example, in some embodiments, the gate insulation layer 120 may have a lower oxide film, a nitride film and an upper oxide film (i.e., an ONO structure).

A barrier layer 125 is formed on the gate insulation layer 120. The barrier layer 125 may also be conformally formed along a profile of the gate insulation layer 120. The barrier layer 125 may be formed using metal and/or a metal compound. For example, the barrier layer 125 may include titanium (Ti), titanium nitride (TiNx), tungsten (W), tungsten nitride (WNx), tantalum (Ta), tantalum nitride (TaNx), aluminum (Al), aluminum nitride (AlNx), titanium aluminum nitride (TiAlxNy), titanium silicon nitride (TiSixNy), etc. These may be used alone or in a combination thereof. The barrier layer 125 may be formed by a CVD process, an ALD process, a sputtering process, a PLD process, an evaporation process, etc.

The barrier layer 125 may reduce or prevent metal atoms or metal ions in layers that include metal from diffusing into the active region of the substrate 100 in successive manufacturing processes. The barrier layer 125 may have a relatively small thickness of, for example, about 30 Å to about 50 Å.

Figure 4:
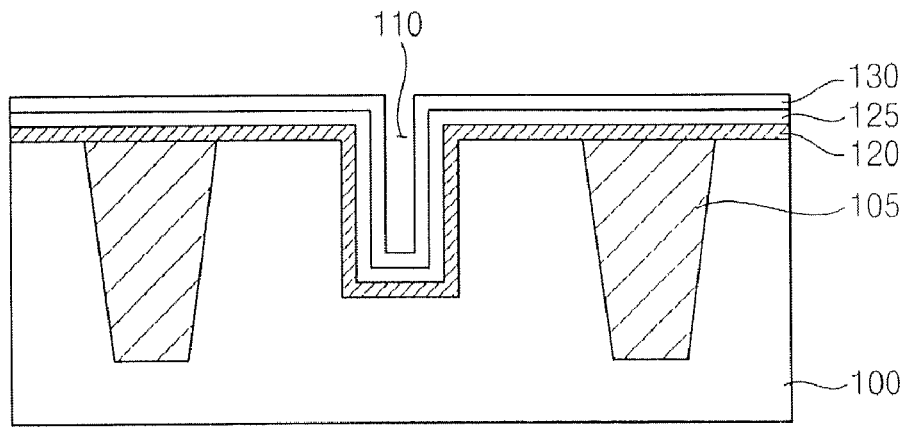

Referring to FIG. 4, a preliminary nucleation layer 130 is formed on the barrier layer 125. The preliminary nucleation layer 130 may be uniformly formed on the barrier layer 125 along profiles of the first recess 110 and the substrate 100. The preliminary nucleation layer 130 may be formed using metal. For example, the preliminary nucleation layer 130 may include tungsten, molybdenum (Mo), manganese (Mn), chrome (Cr), ruthenium (Ru), iridium (Ir), etc. These may be used along or in a mixture thereof. The preliminary nucleation layer 130 may be formed on the barrier layer 125 by an ALD process, a CVD process, a sputtering process, a PLD process, etc. In one example embodiment, the preliminary nucleation layer 130 may comprise tungsten that is deposited by an ALD process.

Figure 16A:
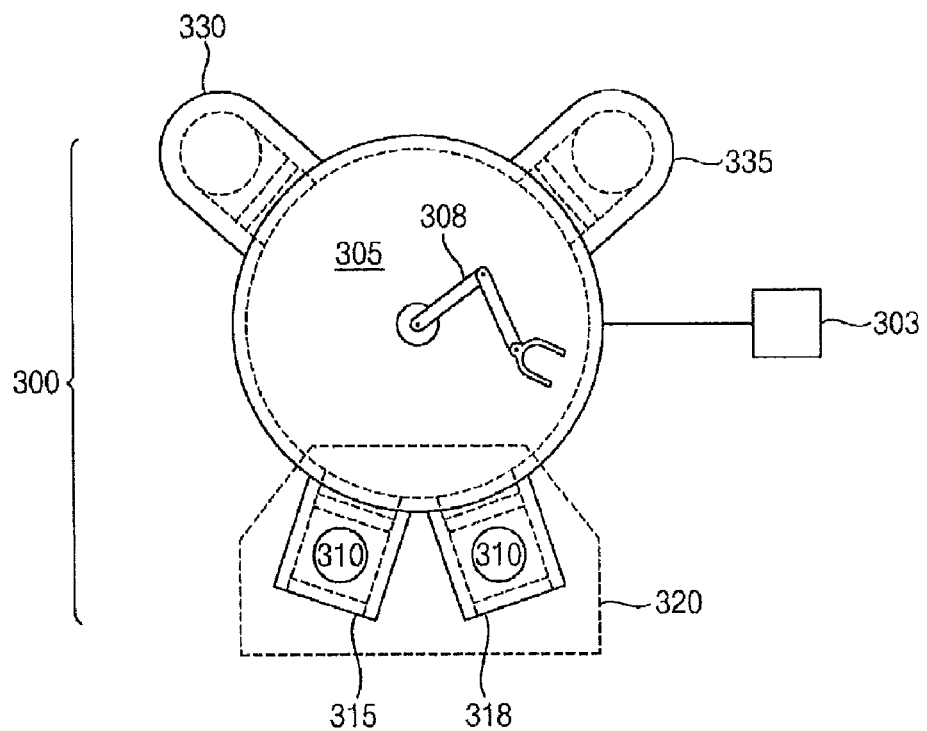
FIG. 16A is a plan view illustrating an apparatus for forming a preliminary nucleation layer in accordance with example embodiments.

According to example embodiments, the preliminary nucleation layer 130 may be formed using an apparatus for forming a preliminary nucleation layer. FIG. 16A is a plan view illustrating an apparatus for forming a preliminary nucleation layer in accordance with example embodiments. The apparatus illustrated in FIG. 16A may produce a preliminary nucleation layer by an ALD process.

Referring to FIG. 16A, the apparatus 300 includes a robot 308 installed on a transfer section 305. A transfer gate 320 is disposed adjacent to the transfer section 305. The transfer gate 320 includes a plurality of carriers 315 and 318. Substrates 310 may be located on the carriers 315 and 318 before treating the substrates 310 and/or after treating the substrates 310.

The apparatus 300 further includes a control section 303 and a plurality of reaction chambers 330 and 335 where nucleation layers are formed on the substrates 310. The robot 308 may transfer the substrates 310 from the carriers 315 and 318 into the reaction chambers 330 and 335. The robot 308 may also transfer the substrates 310 from the reaction chambers 330 and 335 into the carriers 315 and 318. The control section 303 may control processes for forming the nucleation layers on the substrates 310 using the apparatus 300.

Referring to FIGS. 4 and 16A, the preliminary nucleation layer 130 is formed on the barrier layer 125 using the apparatus 300. The preliminary nucleation layer 130 may have a thickness of, for example, about 10 Å to about 50 Å measured from an upper face of the barrier layer 125 outside of the recess 110.

In the formation of the preliminary nucleation layer 130 by the ALD process, the preliminary nucleation layer 130 may have a β crystalline phase when the preliminary nucleation layer 130 is formed using tungsten. As such, the preliminary nucleation layer 130 may have a relatively high specific resistance. If the preliminary nucleation layer 130 of tungsten has the relatively high specific resistance, the preliminary nucleation layer 130 may not be included in the buried gate structure because the buried gate structure may also have a relatively high resistance due to the preliminary nucleation layer 130. Further, when the buried gate structure has a minute critical dimension (CD) below about 20 nm, the buried gate structure including the preliminary nucleation layer 130 of the β crystalline phase may have a more increased resistance because a thickness of a conductive layer of the buried gate structure may decrease as the thickness of the preliminary nucleation layer 130 increases. Therefore, a semiconductor device including the buried gate structure may also have poor electric characteristics.

Generally, a crystalline structure of the preliminary nucleation layer 130 should be changed from a β crystalline phase into an α crystalline phase when the preliminary nucleation layer 130 is formed using tungsten by the ALD process. However, the preliminary nucleation layer 130 may not have the α crystalline phase when the preliminary nucleation layer 130 is formed using a conventional apparatus for forming a nucleation layer.

Figure 5:
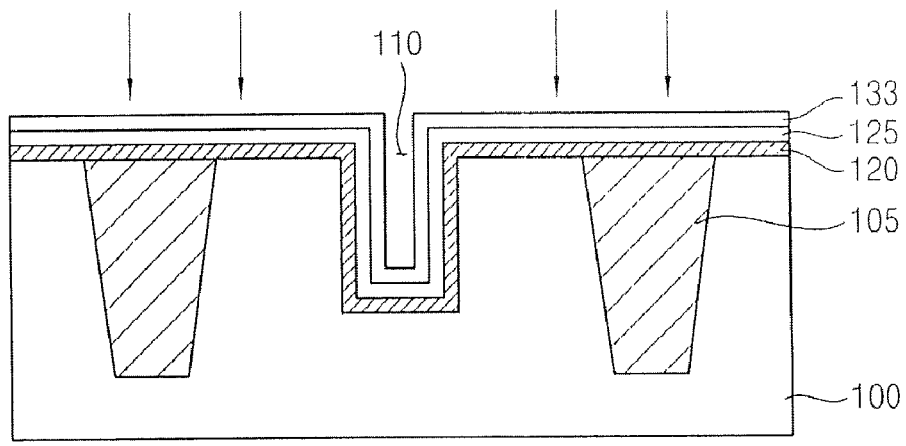

Referring to FIG. 5, the preliminary nucleation layer 130 having the β crystalline phase may be treated after it is formed on the barrier layer 125. Thus, a nucleation layer 133 having an α crystalline phase may be provided on the barrier layer 125. For example, the preliminary nucleation layer 130 may be converted into the nucleation layer 133 having the α crystalline phase by a thermal treatment process such as a rapid thermal annealing (RTA) process, a spike RTA process, a flash RTA process, a laser annealing process, etc. Although the nucleation layer 133 is formed on the barrier layer 125, the first recess 110 may be partially filled with the gate insulation layer 120, the barrier layer 125 and the nucleation layer 130.

Figure 16B:
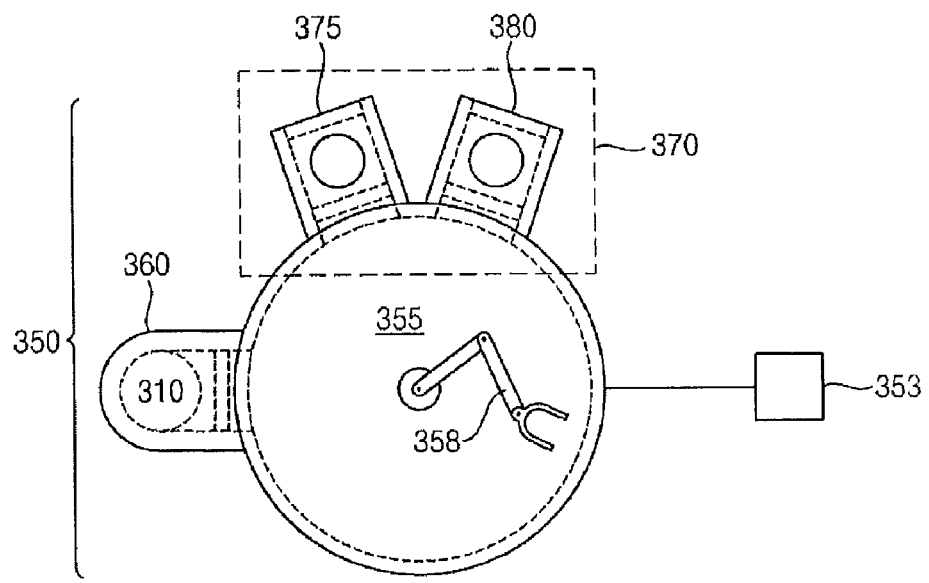
FIG. 16B is a plan view illustrating an apparatus for treating a preliminary nucleation layer in accordance with example embodiments.

In thermally treating the preliminary nucleation layer 130, the crystalline phase of the preliminary nucleation layer 130 may be changed using an apparatus for treating a preliminary nucleation layer. FIG. 16B is a plan view illustrating an apparatus for treating a preliminary nucleation layer in accordance with example embodiments. The apparatus illustrated in FIG. 16B may thermally treat the preliminary nucleation layer to produce a nucleation layer.

Referring to FIG. 16B, the apparatus 350 includes a transfer section 355 having a robot 358 for transferring substrates 310 to be thermally treated. The apparatus 350 additionally includes a transfer gate 370 and a reaction chamber 360. The operations of the transfer section 355, the transfer gate 370 and the reaction chamber 360 may be controlled by a control section 353. The transfer gate 370 has a plurality of carriers 375 and 380 for the substrates 310.

Referring to FIGS. 5 and 16B, the substrates 310 having the preliminary nucleation layer 130 may be thermally treated in the reaction chamber 360, and then the substrates 310 having the nucleation layer 133 may be transferred into the carriers 375 and 380 by the robot 358.

When the preliminary nucleation layer 130 is thermally treated in the reaction chamber 360 at, for example, a temperature of about 700° C. to about 900° C. under a relatively low partial pressure of oxygen ($O_2$), impurities included in the preliminary nucleation layer 130 may be effectively reduced to obtain the nucleation layer 133 having the α crystalline phase. For example, impurities such as boron (B), fluorine (F), carbon (C), etc, may be removed from the preliminary nucleation layer 130 having the β crystalline phase, so that the nucleation layer 133 may have the α crystalline phase. When the nucleation layer 133 has the α crystalline phase, the nucleation layer 133 may have a relatively low specific resistance.

In some example embodiments, the preliminary nucleation layer 130 having the β crystalline phase may be treated at a temperature of, for example, about 1,000° C. to about 1,500° C. to obtain the nucleation layer 133 having the α crystalline phase. When the preliminary nucleation layer 130 includes tungsten that may have a high melting point, the preliminary nucleation layer 130 may be treated by an annealing process performed at a ultra high temperature, for example, a millisecond annealing process. As a result, the nucleation layer 133 having the α crystalline phase may be provided that has a reduced specific resistance.

According to example embodiments, the preliminary nucleation layer 130 and the nucleation layer 133 may be formed using different apparatuses. Therefore, the nucleation layer 133 may have a resistance that is suitable for the buried gate structure. Nearly 100% of the nucleation layer 133 may have the α crystalline phase. However, the nucleation layer 133 may have a small amount of β crystalline phase sections after the thermal treatment on the preliminary nucleation layer 130.

Figure 6:
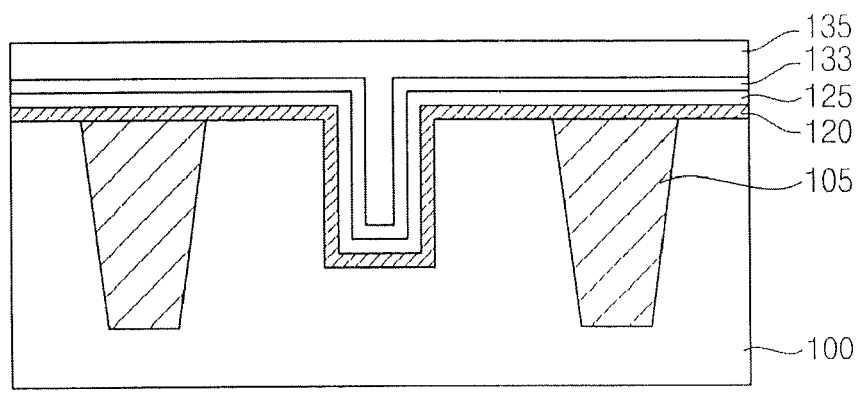

Referring to FIG. 6, a conductive layer 135 that includes metal is formed on the nucleation layer 133. The conductive layer 135 may fully fill the remainder of the first recess 110. The conductive layer 135 may be grown from the nucleation layer 133, so that the conductive layer 135 may have a crystalline structure that is substantially the same as or substantially similar to the crystalline structure of the nucleation layer 133. When the nucleation layer 133 includes tungsten of the α crystalline phase, the conductive layer 135 may also have an α crystalline phase. Thus, the conductive layer 135 may have a low specific resistance in accordance with that of the nucleation layer 133. The conductive layer 135 may be formed, for example, by an ALD process, a CVD process, a PECVD process, etc.

As for a conventional gate structure, a conductive layer of tungsten having an α crystalline phase may not be directly formed on a barrier metal layer. However, according to example embodiments, a conductive layer including tungsten of an α crystalline phase may be properly formed on a barrier layer through a phase transition process including a thermal treatment. Therefore, the buried gate structure including the conductive layer and the barrier layer may be easily obtained when the buried gate structure has a small critical dimension for semiconductor devices that include a buried gate structure and have a reduced design rule.

Figure 7:
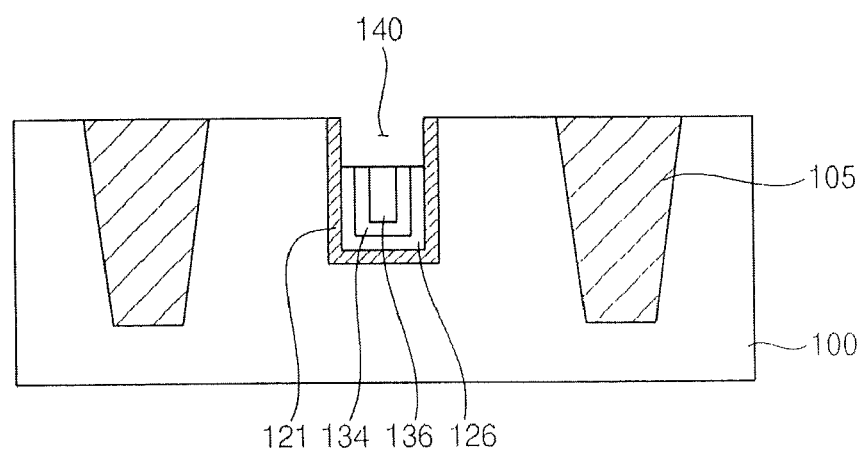

Referring to FIG. 7, the conductive layer 135, the nucleation layer 133, the barrier layer 125 and the gate insulation layer 120 are partially removed to form a gate insulation layer pattern 121, a barrier layer pattern 126, a nucleation layer pattern 134 and a conductive layer pattern 136 in the first recess 110.

The gate insulation layer pattern 121, the barrier layer pattern 126, the nucleation layer pattern 134 and the conductive layer pattern 136 may be formed in the first recess 110 by removing portions of the conductive layer 135, the nucleation layer 133, the barrier layer 125 and the gate insulation layer 120 until the substrate 100 is exposed. Here, the portions of the conductive layer 135, the nucleation layer 133, the barrier layer 125 and the gate insulation layer 120 may be removed by, for example, a chemical mechanical polishing (CMP) process and/or an etch-back process. The barrier layer pattern 126, the nucleation layer pattern 134 and the conductive layer pattern 136 may be formed by a dry etching process or a wet etching process.

The gate insulation layer pattern 121 may be located on the bottom and the sidewalls of the first recess 110. The barrier layer pattern 126, the nucleation layer pattern 134 and the conductive layer pattern 136 may only partially fill the remainder of the first recess 110. Namely, each of the barrier layer pattern 126, the nucleation layer pattern 134 and the conductive layer pattern 136 may have a height that is substantially smaller than a height of the gate insulation layer pattern 121. As a result, a second recess 140 is provided on the barrier layer pattern 126, the nucleation layer pattern 134 and the conductive layer pattern 136.

Figure 8:
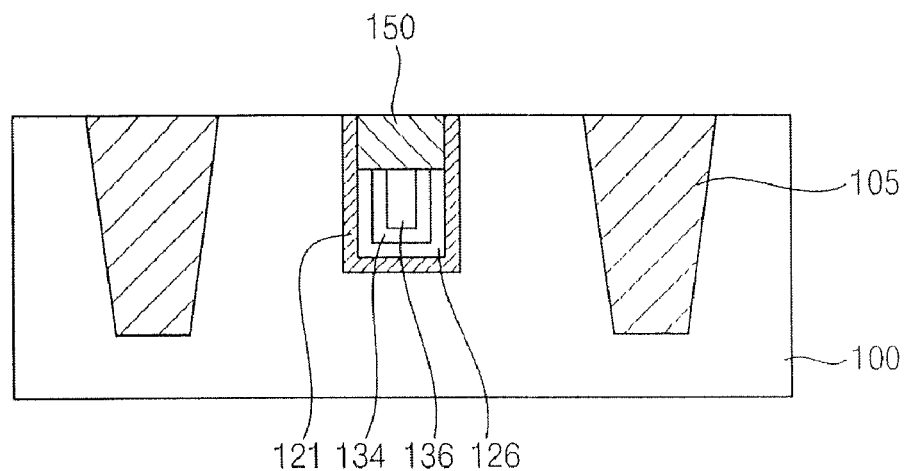

Referring to FIG. 8, a gate mask 150 is formed on the barrier layer pattern 126, the nucleation layer pattern 134 and the conductive layer pattern 136. The gate mask 150 may completely fill the second recess 140. The gate mask 150 may comprise a material that has an etching selectivity with respect to the substrate 100, the gate insulation layer pattern 121, the barrier layer pattern 126, the nucleation layer pattern 134 and/or the conductive layer pattern 136. For example, the gate mask 150 may include a nitride such as silicon nitride or an oxynitride like silicon oxynitride.

In example embodiments, a gate mask layer (not illustrated) may be formed on the substrate 100 to fill the second recess 140, and then the gate mask layer may be partially removed until the substrate 100 is exposed to form a gate mask 150 that fills the second recess 140 on the barrier layer pattern 126, the nucleation layer pattern 134 and the conductive layer pattern 136. The gate mask layer may be formed by a CVD process, a PECVD process, an LPCVD process, etc.

When the gate mask 150 is provided in the second recess 140, the buried gate structure is formed on the substrate 100. The buried gate structure may have a desirably low resistance because the conductive layer pattern 136 has the low specific resistance in accordance with that of the nucleation layer pattern 134. When a transistor includes the buried gate structure, the transistor may also have a low resistance that may improve electrical characteristics of a semiconductor device having the transistor.

FIGS. 9 to 15 are cross sectional views illustrating a method of forming a buried gate structure in accordance with further example embodiments. In the method illustrated in FIGS. 9 to 15, a preliminary nucleation layer and a nucleation layer of a buried gate structure may be formed using a single apparatus.

Figure 9:
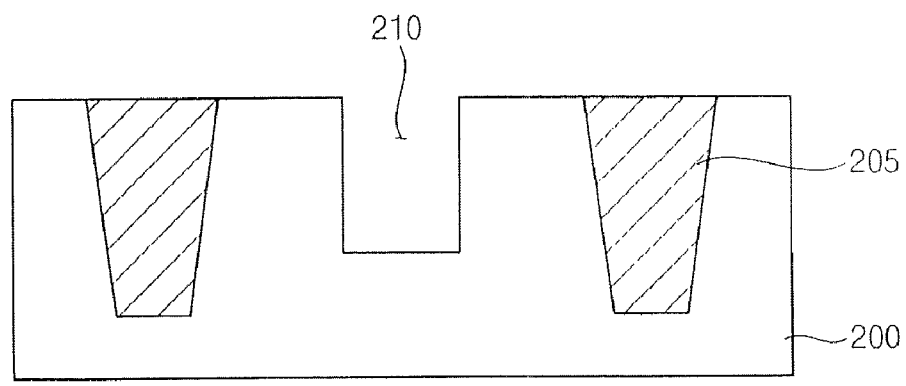
FIGS. 9 to 15 are cross sectional views illustrating a method of forming a buried gate structure in accordance with further example embodiments.

Referring to FIG. 9, an isolation layer 205 is formed on a substrate 200, so that an active region and an isolation region of the substrate 200 are defined. The substrate 200 may comprise a semiconductor substrate such as, for example, a silicon substrate, a germanium substrate, a silicon-germanium substrate, etc. Alternatively, the substrate 200 may comprise a substrate having a semiconductor layer such as, for example, an SOI substrate, a GOI substrate, etc.

The isolation layer 205 may be formed using oxide by a CVD process, a thermal oxidation process, a spin coating process, a PECVD process, an HDP-CVD process, etc. In example embodiments, the isolation layer 205 may be obtained by an isolation process such as an STI process. In the STI process, a trench may be formed on the substrate 200 by partially etching the substrate 200, and an oxide layer may be formed on the substrate 200 to fill the trench. In some example embodiments, a sidewall oxide layer and/or a nitride liner may be formed on a sidewall of the trench. After partially removing the oxide layer until the substrate 200 is exposed, the isolation layer 205 may be formed in the trench. The isolation layer 205 may be formed, for example, by a CMP process and/or an etch-back process.

A first recess 210 is formed in the active region of the substrate 200 using a pad oxide layer pattern (not illustrated) and a hard mask (not illustrated) as etching masks. The pad oxide layer pattern may be formed using silicon oxide by a CVD process, a PECVD process, an LPCVD process, an HDP-CVD process, etc. The hard mask may be formed using nitride or oxynitride by a CVD process, a PECVD process, an LPCVD process, etc. Alternatively, the hard mask may have a multi-layer structure that includes, for example, an oxide film, an organic material film and an anti reflective film. The first recess 210 may have an enlarged lower portion having a circular cross section, a polygonal cross section, an elliptical cross section, etc. After the first recess 210 in the active region of the substrate 200 is formed, the hard mask and the pad oxide layer pattern are removed.

Figure 10:
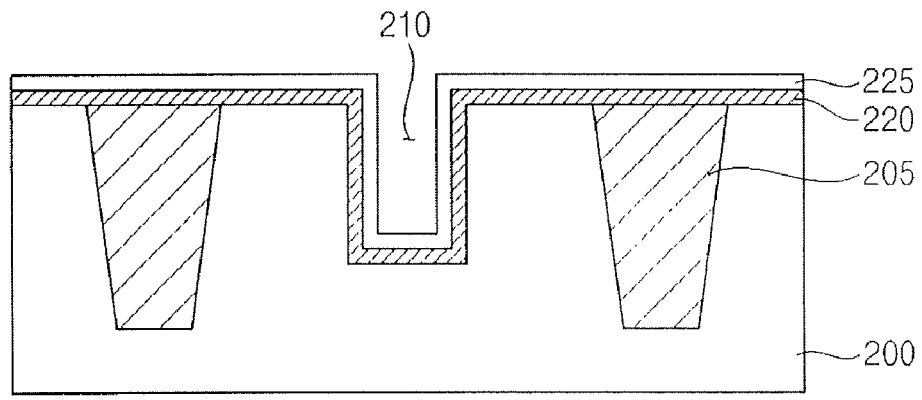

Referring to FIG. 10, a gate insulation layer 220 and a barrier layer 225 are successively formed in the first recess 210 and on the substrate 200. The gate insulation layer 220 and the barrier layer 225 may be conformally formed along profiles of the first recess 210 and the substrate 200. The gate insulation layer 220 may be formed using oxide and/or metal oxide by a CVD process, a sputtering process, an evaporation process, an ALD process, a PLD process, etc. In example embodiments, the gate insulation layer 220 may have a multi-layer structure that includes at least one oxide film and/or at least one nitride film.

The barrier layer 225 may be formed using metal and/or a metal compound by a CVD process, an ALD process, a sputtering process, a PLD process, an evaporation process, etc. The barrier layer 225 may reduce or prevent metal atoms or metal ions in metal included in the buried gate structure from diffusing into the substrate 200. The barrier layer 225 may have a relatively thin thickness of, for example, about 30 Å to about 50 Å to be easily combined with the gate insulation layer 220.

Figure 11:
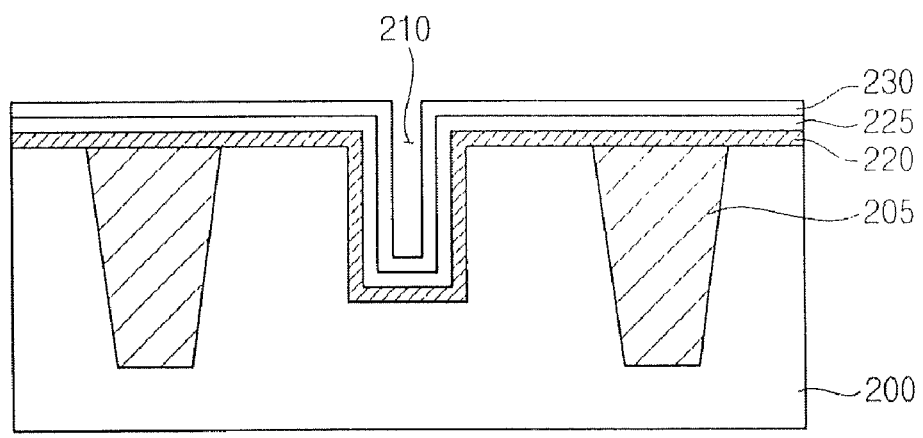

Referring to FIG. 11, a preliminary nucleation layer 230 is uniformly formed on the barrier layer 225 along profiles of the first recess 210 and the substrate 200. The preliminary nucleation layer 230 may be formed using metal by an ALD process, a CVD process, a sputtering process, a PLD process, etc. In one example embodiment, the preliminary nucleation layer 230 may be formed using tungsten by an ALD process. When the preliminary nucleation layer 230 is formed on the barrier layer 225, the first recess 210 may be partially filled with the gate insulation layer 220, the barrier layer 225 and the preliminary nucleation layer 230.

Figure 17:
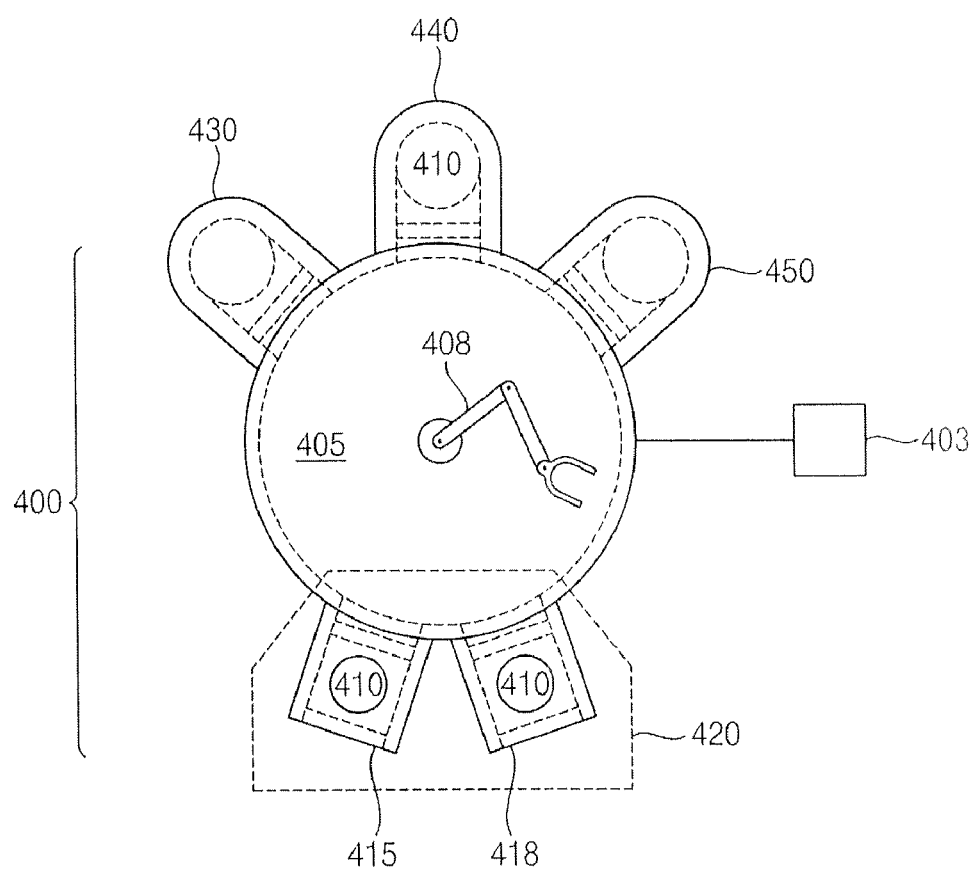
FIG. 17 is a plan view illustrating an apparatus for forming a nucleation layer in accordance with example embodiments.

According to example embodiments, the preliminary nucleation layer 230 may be formed using an apparatus for forming a nucleation layer. FIG. 17 is a plan view illustrating an apparatus for forming a nucleation layer in accordance with example embodiments. The apparatus illustrated in FIG. 17 may form and treat a preliminary nucleation layer to produce a nucleation layer.

Referring to FIG. 17, the apparatus 400 includes a robot 408 installed on a transfer section 405. A transfer gate 420 is disposed adjacent to the transfer section 405. The transfer gate 420 includes a plurality of carriers 415 and 418. Substrates 410 may be placed on the carriers 415 and 418 of the transfer gate 420 before and after treating the substrates 410. The apparatus 400 further includes a control section 403 and a plurality of reaction chambers 430, 440 and 450 in which preliminary nucleation layers are formed on the substrates 410 and the preliminary nucleation layers on the substrates 410 are treated. The robot 408 may transfer the substrates 410 from the carriers 415 and 418 into the reaction chambers 430, 440 and 450. The robot 408 may also transfer the substrates 410 from the reaction chambers 430, 440 and 450 into the carriers 415 and 418. The control section 403 may control processes for forming the nucleation layers on the substrates 410 using the apparatus 400.

Referring to FIGS. 11 and 17, the preliminary nucleation layer 230 is formed on the barrier layer 225 using the apparatus 400 illustrated in FIG. 17. The preliminary nucleation layer 230 may have a thickness of, for example, about 10 Å to about 50 Å. In the formation of a tungsten preliminary nucleation layer 230 by the ALD process, the preliminary nucleation layer 230 may include tungsten of a β crystalline phase having a relatively high specific resistance. When the tungsten preliminary nucleation layer 230 has the relatively high specific resistance, the preliminary nucleation layer 230 may not be employed in the buried gate structure because a resistance of the buried gate structure may also be increased.

Figure 12:
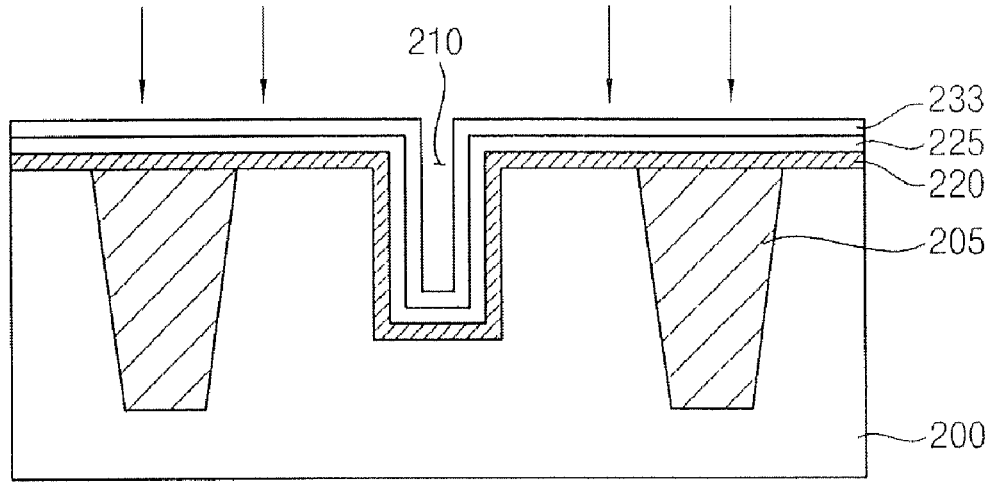

Referring to FIGS. 12 and 17, the preliminary nucleation layer 230 including tungsten of the β crystalline phase is treated using the apparatus 400 to form a nucleation layer 233 including tungsten having an α crystalline phase on the barrier layer 225. Thus, the formation and the treatment of the preliminary nucleation layer 230 may be performed using a single apparatus such as the apparatus 400 described with reference to FIG. 17. In other words, the preliminary nucleation layer 230 and the nucleation layer 233 may be formed in-situ.

The nucleation layer 233 having the α crystalline phase may be formed by a thermal treatment process such as, for example, an RTA process, a spike RTA process, a flash RTA process, a laser annealing process, a millisecond annealing process, etc. Here, the preliminary nucleation layer 230 may be thermally treated at a temperature of about 700° C. to about 1,500° C. under a relatively low partial pressure of oxygen. During this thermal treatment, impurities such as boron, fluorine or carbon that are in the preliminary nucleation layer 230 may be efficiently removed to produce the nucleation layer 233 having the α crystalline phase. When the nucleation layer 233 has the α crystalline phase, the nucleation layer 233 may have a desired low specific resistance.

In example embodiments, the preliminary nucleation layer 230 and the nucleation layer 133 may be formed using one apparatus. Thus, the nucleation layer 233 may have a low resistance for the buried gate structure through the above-described process for reducing the specific resistance of the nucleation layer 233.

Figure 13:
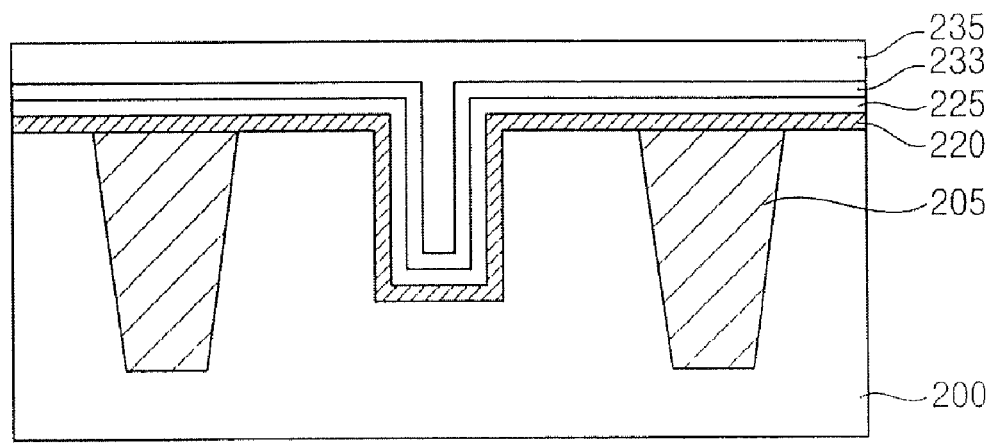

Referring to FIG. 13, a conductive layer 235 is formed on the nucleation layer 233 using metal to completely fill the first recess 210 by an ALD process, a CVD process, a PECVD process, etc. The conductive layer 235 may be grown from the nucleation layer 233 having the α crystalline phase, and thus the conductive layer 235 may have a crystalline structure substantially the same as or substantially similar to that of the nucleation layer 233. Thus, the conductive layer 235 may have a low specific resistance in accordance with that of the nucleation layer 233.

Figure 14:
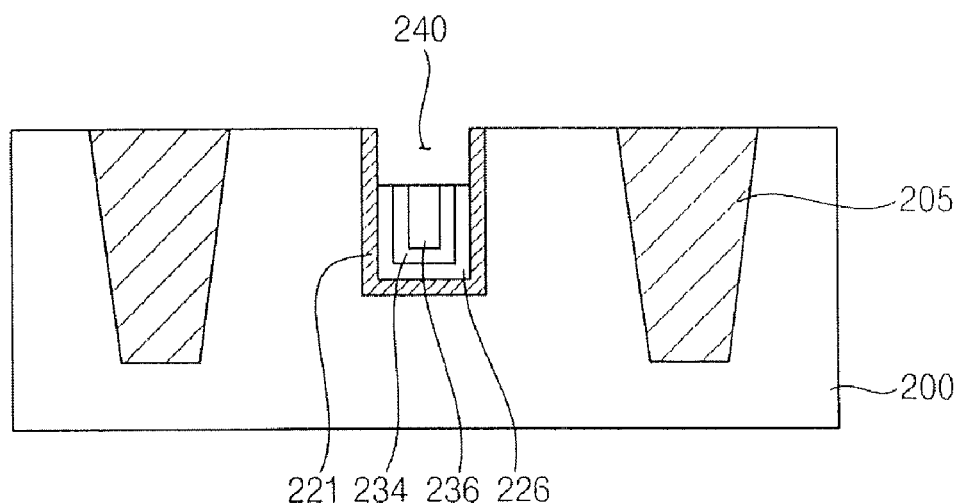

Referring to FIG. 14, the conductive layer 235, the nucleation layer 233, the barrier layer 225 and the gate insulation layer 220 are partially removed to form a gate insulation layer pattern 221, a barrier layer pattern 226, a nucleation layer pattern 234 and a conductive layer pattern 236 in the first recess 210. The gate insulation layer pattern 221, the barrier layer pattern 226, the nucleation layer pattern 234 and the conductive layer pattern 236 may be formed by etching the conductive layer 235, the nucleation layer 233, the barrier layer 225 and the gate insulation layer 220 until the substrate 200 is exposed. Hence, the gate insulation layer pattern 221 is formed on the bottom and the sidewall of the first recess 210. Then, the conductive layer 235, the nucleation layer 233 and the barrier layer 225 are secondarily etched to sequentially form the barrier layer pattern 226, the nucleation layer pattern 234 and the conductive layer pattern 236 on the gate insulation layer 221.

In example embodiments, the barrier layer pattern 226, the nucleation layer pattern 234 and the conductive layer pattern 236 may be formed through two etching processes, however, the gate insulation layer pattern 221 may be obtained by one etching process. The barrier layer pattern 226, the nucleation layer pattern 234 and the conductive layer pattern 236 may have heights that are substantially smaller than a height of the gate insulation layer pattern 221. Thus, a second recess 240 is provided above the barrier layer pattern 226, the nucleation layer pattern 234 and the conductive layer pattern 236.

Figure 15:
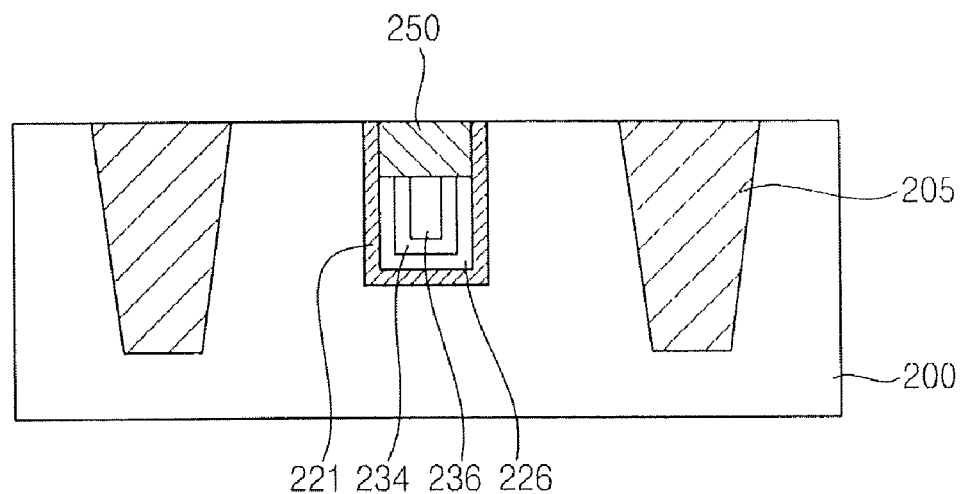

Referring to FIG. 15, a gate mask 250 is formed on the barrier layer pattern 226, the nucleation layer pattern 234 and the conductive layer pattern 236. The gate mask 250 may fill up the second recess 240. The gate mask 250 may comprise a material that has an etching selectivity with respect to the substrate 200, the barrier layer pattern 226, the nucleation layer pattern 234 and/or the conductive layer pattern 236. For example, the gate mask 250 may be formed of an oxide, a nitride or an oxynitride by a CVD process, a PECVD process, an LPCVD process, an HDP-CVD process, etc. As a result, there is provided on the substrate 200 the buried gate structure including the gate insulation layer pattern 221, the barrier layer pattern 226, the nucleation layer pattern 234 and the conductive layer pattern 236. When source/drain regions (not illustrated) may be formed at portions of the active region adjacent to the buried gate structure, a transistor having the buried gate structure may be formed on the substrate 200.

According to example embodiments, the buried gate structure may have a low resistance because the conductive layer pattern 236 and the nucleation layer pattern 234 have low specific resistances. Because the transistor includes the buried gate structure having the above-described construction, the transistor may also have a desired low resistance to thereby enhance operational characteristics of a semiconductor device that includes the transistor. The preliminary nucleation layer 230 and the nucleation layer 233 may be formed in-situ using one apparatus, so that manufacturing processes of forming the buried gate structure may be efficiently simplified to reduce manufacturing time and manufacturing cost thereof.

FIGS. 18 to 32 are cross sectional views illustrating a method of manufacturing a semiconductor device including a buried gate structure in accordance with still further example embodiments.

Figure 18:
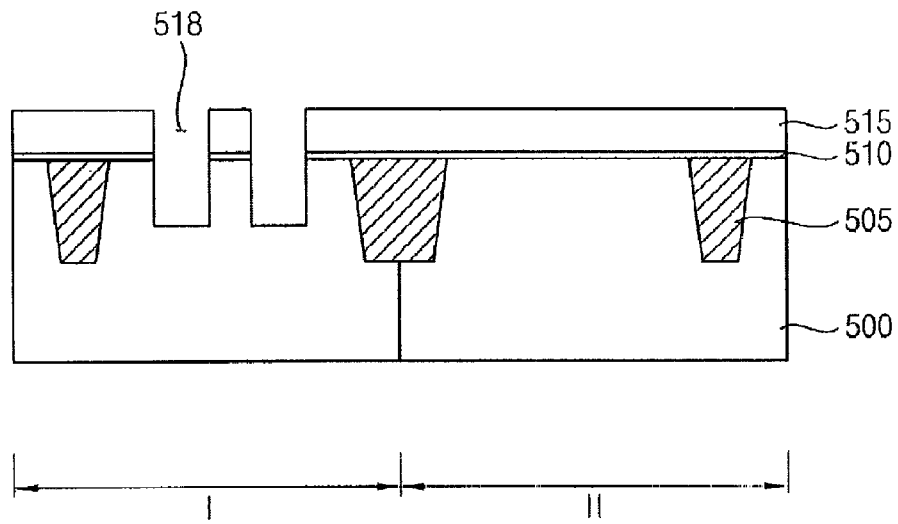
FIGS. 18 to 32 are cross sectional views illustrating a method of manufacturing a semiconductor device including a buried gate structure in accordance with still further example embodiments.

Referring to FIG. 18, an isolation layer 505 is formed on a substrate 500 having a cell area I and a peripheral circuit area II. Memory cells may be formed in the cell area I whereas circuit elements and/or logic elements may be disposed in the peripheral circuit area II. The isolation layer 505 may define active regions in the substrate 500 in the cell and the peripheral circuit areas I and II. The substrate 500 may comprise a semiconductor substrate or a substrate having a semiconductor layer.

The isolation layer 505 may be formed using an oxide such as, for example, silicon oxide. The isolation layer 505 may be formed by an isolation process such as an STI process. When the isolation layer 505 is formed by the STI process, the isolation layer 505 may be positioned in a trench after forming the trench by partially etching the substrate 500.

In some example embodiments, a sidewall oxide layer may be formed on a sidewall of the trench before forming the isolation layer 505 to cure etched damage to the substrate 500. Further, a nitride liner may be formed on the sidewall oxide layer or the sidewall of the trench.

A pad oxide layer (not illustrated) is formed on the substrate 500. The pad oxide layer may be formed using oxide by a thermal oxidation process, a CVD process, a PECVD process, an LPCVD process, an HDP-CVD process, etc. In one example embodiment, the pad oxide layer may include silicon oxide obtained by the thermal oxidation process. The pad oxide layer may have a relatively small thickness of, for example, about 50 Å to about 150 Å.

A hard mask layer (not illustrated) is formed on the pad oxide layer by, for example, a CVD process, a PECVD process, an LPCVD process, etc. The hard mask layer may be formed using a material having an etching selectivity relative to the substrate 500 and the pad oxide layer. For example, the hard mask layer may be formed using silicon nitride or silicon oxynitride.

In some example embodiments, the hard mask layer may have a multi-layer structure that includes an oxide film, an organic material film and an anti-reflective film. The oxide film may include silicon oxide and may have a thickness of about 2,000 Å to about 3,000 Å. The organic material film may include amorphous carbon and may have a thickness of about 2,000 Å to about 3,000 Å. Further, the anti-reflective film may include silicon nitride and may have a thickness of, for example, about 300 Å to about 800 Å.

The hard mask layer and the pad oxide layer are patterned to form a hard mask 515 and a pad oxide layer pattern 510 on the substrate 500. The hard mask 515 and the pad oxide layer pattern 510 may be formed by a photolithography process.

Using the hard mask 515 and the pad oxide layer pattern 510 as etching masks, a portion of the active region is etched to form a first recess 518 in the active region. The first recess 518 may be formed by an anisotropic etching process.

In some example embodiments, the first recess 518 may have an enlarged lower portion. The enlarged lower portion of the first recess may have a cross section of a circular shape, a polygonal shape, an elliptical shape, etc. The enlarged lower portion of the first recess 518 may be formed by an isotropic etching process after forming the first recess 510 by the anisotropic etching process. When the first recess 518 has the enlarged lower portion, the buried gate structure may also have an enlarged lower portion to thereby increase a channel length of a first transistor that includes the buried gate structure.

Figure 19:
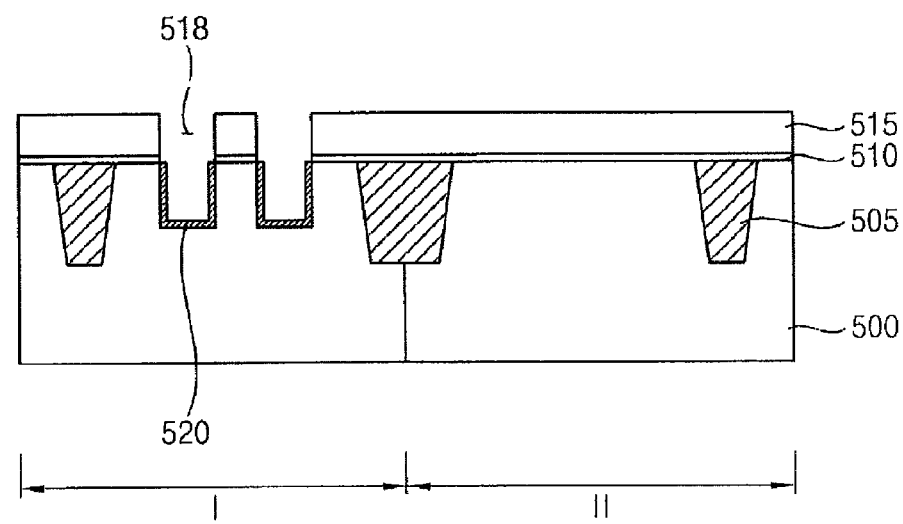

Referring to FIG. 19, a gate insulation layer 520 is formed on the bottom and a sidewall of the first recess 518 in the cell area I of the substrate 500. The gate insulation layer 520 may be uniformly formed on the bottom and the sidewall of the first recess 518. The gate insulation layer 520 may be formed using oxide and/or metal oxide by a CVD process, a sputtering process, an evaporation process, an ALD process, a PLD process, etc. For example, the gate insulation layer 520 may be formed using silicon oxide, hafnium oxide, titanium oxide, aluminum oxide, tantalum oxide, zirconium oxide, etc. These may be used alone or in a mixture thereof.

In some example embodiments, the gate insulation layer 520 may have a multi-layer structure that includes at least one oxide film and/or at least one nitride film. For example, the gate insulation layer 520 may have a lower oxide film, a nitride film and an upper oxide film.

Figure 20:
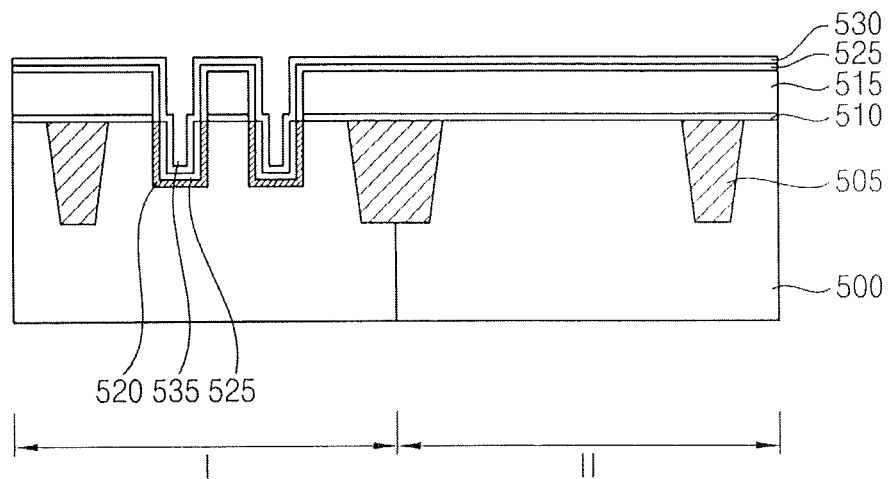

Referring to FIG. 20, a barrier layer 525 is formed on the gate insulation layer 520 and the hard mask 515. The barrier layer 525 may be continuously formed along profiles of the hard mask 515 and the gate insulation layer 520. The barrier layer 525 may be formed using metal and/or metal compound by a CVD process, an ALD process, a sputtering process, a PLD process, an evaporation process, etc. For example, the barrier layer 525 may be formed using titanium Ti, titanium nitride, tungsten, tungsten nitride, tantalum, tantalum nitride, aluminum, aluminum nitride, titanium aluminum nitride, titanium silicon nitride, etc. These may be used alone or in a mixture thereof.

The barrier layer 525 may have a relatively small thickness of for example, about 30 Å to about 50 Å. The barrier layer 525 may reduce or prevent metal atoms or metal ions in the buried gate structure from diffusing into the active region in subsequent manufacturing processes.

A preliminary nucleation layer 530 is formed on the barrier layer 525. The preliminary nucleation layer 530 may also be conformally formed on the barrier layer 525 along a profile of the barrier layer 525. The preliminary nucleation layer 530 may be formed using metal by an ALD process, a CVD process, a sputtering process, a PLD process, etc. For example, the preliminary nucleation layer 530 may be formed using tungsten, molybdenum, manganese, chrome, ruthenium, iridium, etc. These may be used alone or in a combination thereof.

In example embodiments, the preliminary nucleation layer 530 may be formed using an apparatus having a construction substantially the same as or substantially similar to that of the apparatus described with reference to FIG. 16A or FIG. 17. For example, the preliminary nucleation layer 530 may be formed on the barrier layer 525 using the apparatus that includes a transfer section having a robot, a transfer gate having a plurality of carriers where the substrate 500 is loaded, a control section, a plurality of reaction chambers, etc. The robot may transfer the substrate 500 from the carriers into the reaction chambers, and the robot may further transfer the substrate 500 from the reaction chambers into the carriers. The control section may control processes for forming the preliminary nucleation layers on the barrier layer 525 using the apparatus.

In example embodiments, the preliminary nucleation layer 530 is formed using tungsten by the ALD process. The preliminary nucleation layer 530 may have a thickness of, for example, about 10 Å to about 50 Å based on an upper face of the barrier layer 525. When the preliminary nucleation layer 530 is formed using tungsten by the ALD process, the preliminary nucleation layer 530 may have a β crystalline structure having a relatively high specific resistance. Such a preliminary nucleation layer 530 having the relatively high specific resistance may not be employed in certain buried gate structures since the resistance of the buried gate structure may be increased. Additionally, when the buried gate structure has a small critical dimension below about 20 nm, the buried gate structure including the preliminary nucleation layer 530 having the high resistance may have a more increased resistance because a conductive layer in the buried gate structure may have a reduced thickness. As a result, a semiconductor device including the buried gate structure may have poor electric characteristics.

Figure 21:
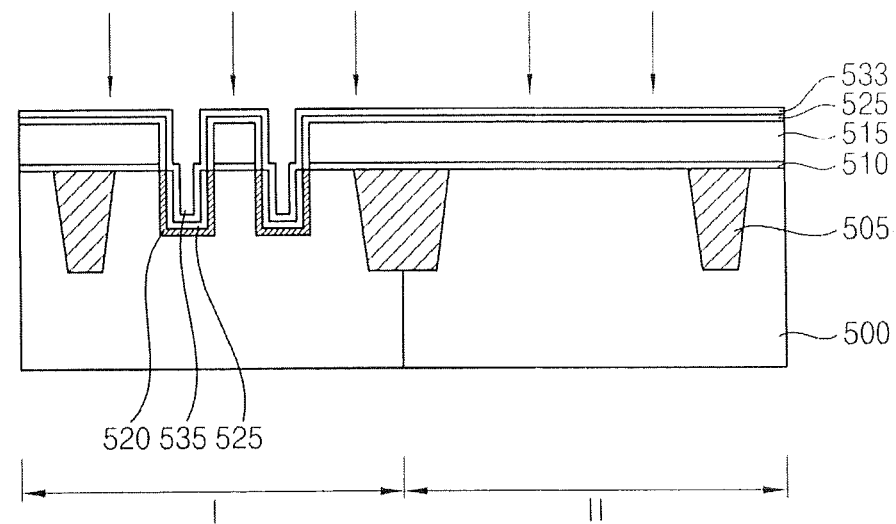

Referring to FIG. 21, the preliminary nucleation layer 530 having the β crystalline phase is changed into a nucleation layer 533 having an α crystalline phase on the barrier layer 525. The nucleation layer 533 having the α crystalline phase may be formed, for example, by performing a thermal treatment process on the preliminary nucleation layer 530. For example, the nucleation layer 533 may be produced by an RTA process, a spike RTA process, a flash RTA process, a laser annealing process, a millisecond annealing process, etc. The preliminary nucleation layer 530 may be thermally treated at a temperature of about 700° C. to about 1,500° C. under a relatively low partial pressure of oxygen. Impurities in the preliminary nucleation layer 530 may be effectively removed to thereby form the nucleation layer 533 having the α crystalline phase. The nucleation layer 533 having the a crystalline phase may have a low specific resistance, so that the buried gate structure including the nucleation layer 533 may also have a low resistance.

In example embodiments, the preliminary nucleation layer 530 may be changed into the nucleation layer 533 using an apparatus having a construction substantially the same as or substantially similar to that of the apparatus described with reference to FIG. 16B. Alternatively, the nucleation layer 533 may be generated from the preliminary nucleation layer 530 using an apparatus having a construction substantially the same as or substantially similar to that of the apparatus described with reference to FIG. 17. Thus, the preliminary nucleation layer 530 and the nucleation layer 533 may be formed in-situ using a single apparatus.

Figure 22:
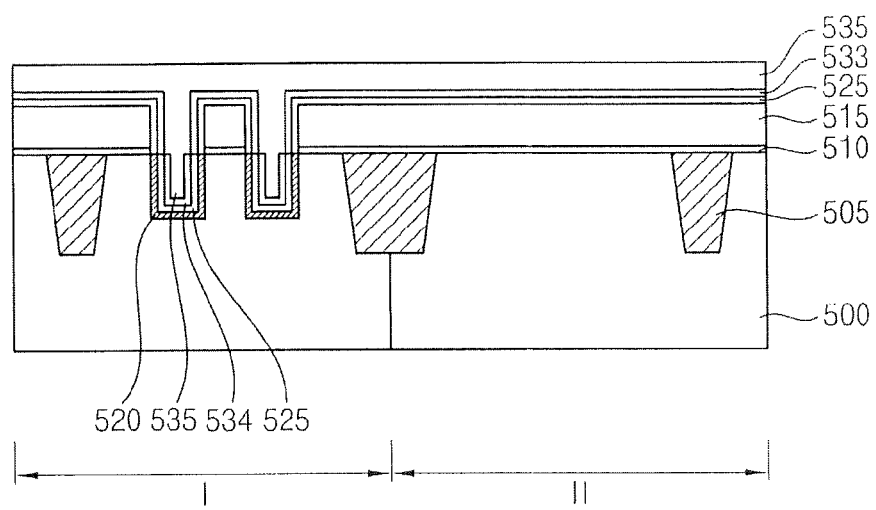

Referring to FIG. 22, a conductive layer 535 is formed on the nucleation layer 533 that is generated from the preliminary nucleation layer 530. The conductive layer 535 may be formed on the nucleation layer 533 to completely fill the first recess 518.

In example embodiments, the conductive layer 535 may be grown from the nucleation layer 533, such that the conductive layer 535 may have a crystalline structure substantially the same as or substantially similar to that of the nucleation layer 533. For example, when the nucleation layer 533 includes tungsten of the α crystalline phase, the conductive layer 535 may also include tungsten having an α crystalline phase. Therefore, the conductive layer 535 may have a low specific resistance in accordance with that of the nucleation layer 533. The conductive layer 535 may be formed, for example, by an ALD process, a CVD process, a PECVD process, etc.

If the conductive layer 535 includes tungsten having the α crystalline phase, the buried gate structure may have a low resistance, and thus the transistor that includes the buried gate structure may have improved electrical characteristics. As a result, the semiconductor device may have enhanced operational and electrical characteristics even though the semiconductor device has a fine design rule below about 20 nm.

Figure 23:
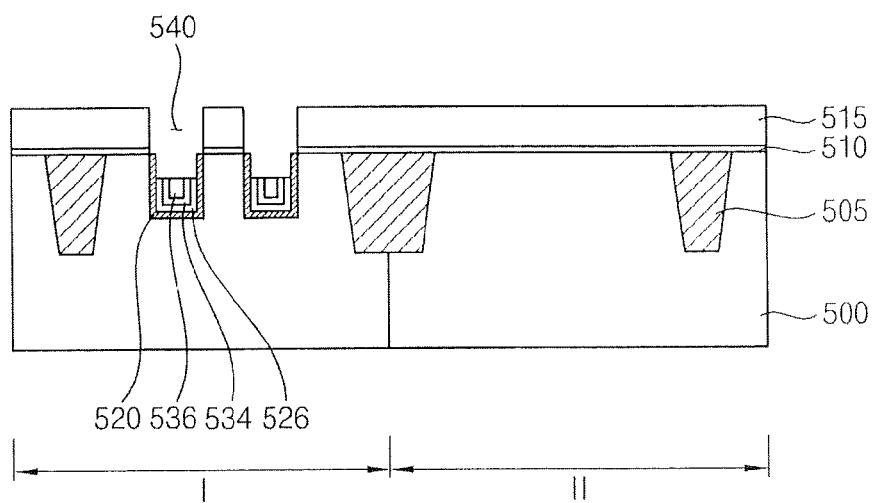

Referring to FIG. 23, the conductive layer 535, the nucleation layer 533 and the barrier layer 525 are partially removed to form a barrier layer pattern 526, a nucleation layer pattern 534 and a conductive layer pattern 536 in the first recess 518. The barrier layer pattern 526, the nucleation layer pattern 534 and the conductive layer pattern 536 may only partially fill up the first recess 518, so that a second recess 540 remains above the barrier layer pattern 526, the nucleation layer pattern 534 and the conductive layer pattern 536. The second recess 540 may also extend through the pad oxide layer pattern 510 and the hard mask 515.

In example embodiments, the barrier layer pattern 526, the nucleation layer pattern 534 and the conductive layer pattern 536 may be formed by a dry etching process or a wet etching process. A CMP process and/or an etch-back process may also be performed on the barrier layer 525, the nucleation layer 530 and the conductive layer 535.

In example embodiments, each of the barrier layer pattern 526, the nucleation layer pattern 534 and the conductive layer pattern 536 may have a height that is substantially smaller than a height of the gate insulation layer pattern 520.

Figure 24:
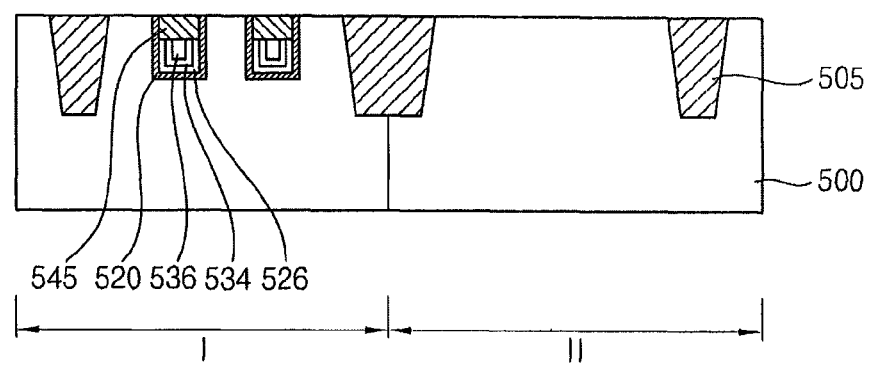

Referring to FIG. 24, a gate mask 545 is formed on the barrier layer pattern 526, the nucleation layer pattern 534 and the conductive layer pattern 536 to completely fill the first recess 518. The gate mask 545 may be formed using a material that has an etching selectivity with respect to the barrier layer pattern 526, the nucleation layer pattern 534 and/or the conductive layer pattern 536. For example, the gate mask 545 may be formed using oxide, nitride, oxynitride, etc. The gate mask 545 may contact the gate insulation layer pattern 520. Namely, a sidewall of the gate mask 545 may make contact with the gate insulation layer pattern 520.

The gate mask 545 may be formed, for example, by forming a gate mask layer (not illustrated) may be formed on the hard mask 515 to fill up the second recess 540. Then, the gate mask layer, the hard mask 515 and the pad oxide layer pattern 510 may be removed to expose the substrate 500, thereby forming the gate mask 545 on the barrier layer pattern 526, the nucleation layer pattern 534 and the conductive layer pattern 536. The gate mask layer may be formed, for example, by a CVD process, a PECVD process, an LPCVD process, etc.

In other embodiments, the gate mask 545 may be formed after the hard mask 515 and the pad oxide layer pattern 510 are removed from the substrate 500.

When the gate mask 540 is formed on the barrier layer pattern 526, the nucleation layer pattern 534 and the conductive layer pattern 536, the buried gate structure is provided in the first recess 518. The buried gate structure includes the gate insulation layer pattern 520, the barrier layer pattern 526, the nucleation layer pattern 534 and the conductive layer pattern 536. The buried gate structure may have a sufficiently low resistance since the conductive layer pattern 536 has a low specific resistance in accordance with the resistance of the nucleation layer pattern 534. Because the transistor includes the buried gate structure, the transistor in the cell area may have a low resistance and enhanced electrical characteristics.

Figure 25:
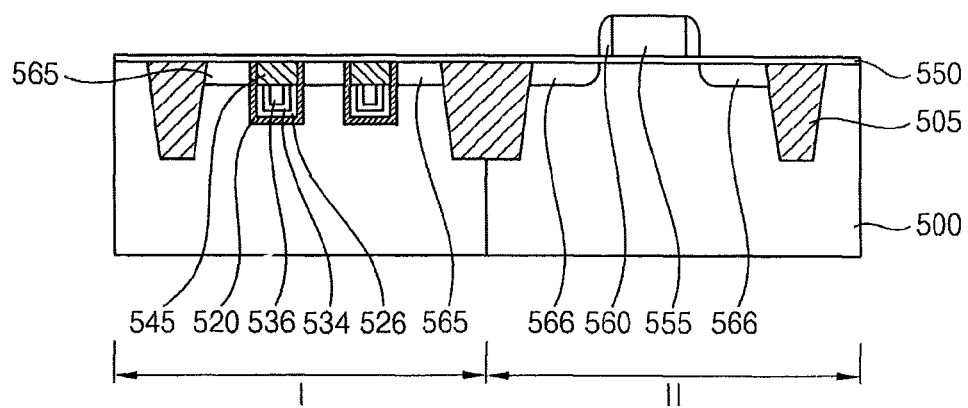

Referring to FIG. 25, an additional gate insulation layer 550 is formed on the substrate 500 having the resultant structures. For example, the additional gate insulation layer 550 may cover the cell area I and the peripheral circuit area II. The additional gate insulation layer 550 may be formed, for example, using oxide and/or metal oxide. In some embodiments, the additional gate insulation layer 550 may be formed using silicon oxide, hafnium oxide, zirconium oxide, tantalum oxide, aluminum oxide, titanium oxide, etc. These may be used alone or in a combination thereof. The additional gate insulation layer 550 may be formed by a thermal oxidation process, a CVD process, a PECVD process, an ALD process, a sputtering process, etc.

A gate electrode 555 is formed on a portion of the additional gate insulation layer 550 in the peripheral circuit area II of the substrate 500. The gate electrode 555 may include polysilicon, metal and/or a metal compound. For example, the gate electrode 555 may be formed using polysilicon doped with impurities, tungsten, tungsten nitride, tungsten silicide (WSix), aluminum, aluminum nitride, titanium, titanium nitride, titanium silicide (TiSix), tantalum, tantalum nitride, etc. These may be used alone or in a combination thereof The gate electrode 555 may be formed by a sputtering process, an ALD process, a PECVD process, a PLD process, an evaporation process, etc.

A spacer 560 is formed on a sidewall of the gate electrode 555 in the peripheral circuit area II. The spacer 560 may include nitride or oxynitride. For example, the spacer 560 may be formed using silicon nitride or silicon oxynitride by a CVD process, a PECVD process, an LPCVD process, etc.

Impurities are doped into portions of the active regions in the cell and the peripheral circuit areas I and II, so that first impurity regions 565 and second impurity regions 566 are formed in the active regions. The first impurity regions 565 may be adjacent to the buried gate structures in the cell area I whereas the second impurity regions 566 may be adjacent to the gate electrode 555 in, the peripheral circuit area II.

In example embodiments, first impurities may be implanted into portions of the active region in the cell area I and second impurities may be implanted into portions of the active region in the peripheral circuit area II. That is, the first and the second impurity regions 565 and 566 may include the first and the second impurities, respectively. The first impurities may have a conductivity type substantially the same as that of the second impurities. Alternatively, the second impurities may have a conductivity type different form that of the first impurities. Namely, the conductivity types of the first and the second impurities may vary in accordance with conductivity types of transistors formed in the cell and the peripheral circuit areas I and II.

When the first and the second impurity regions 565 and 566 are formed on the substrate 500, first transistors and a second transistor are provided on the substrate 500. The first transistors each include the buried gate structure and the first impurity regions 565, and the second transistor includes the gate electrode 555, the spacer 560 and the second impurity regions 566. The first transistors may each have a channel region generated at a portion of the active region enclosing one of the buried gate structures, so that the first transistor may have an increased channel length.

Figure 26:
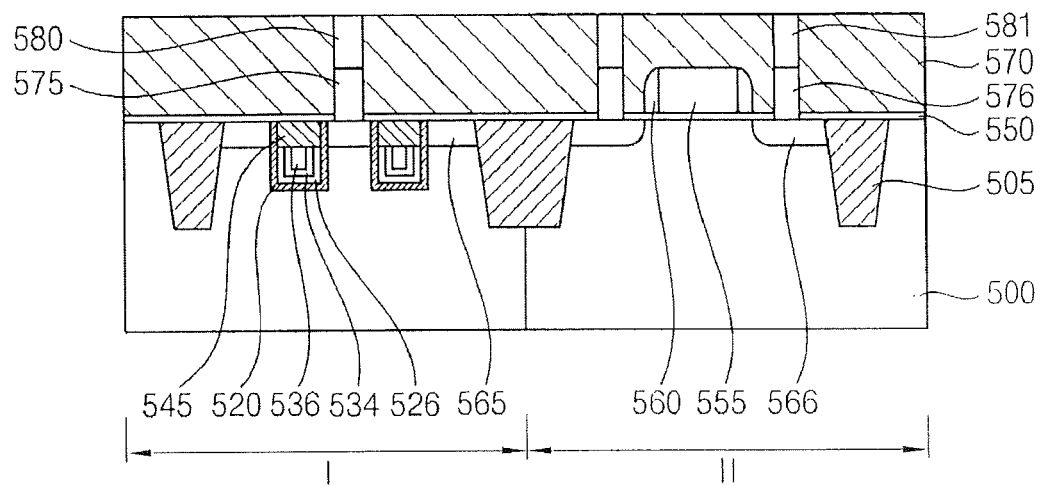

Referring to FIG. 26, an insulating interlayer 570 is formed on the substrate 500 to cover the first and the second transistors. The insulating interlayer 570 may be formed using oxide such as silicon oxide by a CVD process, a PECVD process, a spin coating process, an HDP-CVD process, etc. For example, the insulating interlayer 570 may include USG, SOG, PSG, BPSG, FOX, FSG, TOSZ, TEOS, PE-TEOS, HDP-CVD oxide, etc. The insulating interlayer 570 may have a thickness that is sufficient to cover the first and second transistors. For example, the insulating interlayer 570 may have a thickness of about 1,000 Å to about 3,000 Å.

In example embodiments, a planarization process may be performed on the insulating interlayer 570 so that it has a level surface. For example, the insulating interlayer 570 may have a flat upper face by a CMP process and/or an etch-back process.

In some example embodiments, an etch stop layer (not illustrated) may be formed between the substrate 500 and the insulating interlayer 570. The etch stop layer may be formed using nitride or oxynitride by a CVD process, a PECVD process, an LPCVD process, etc. The etch stop layer may have a relatively small thickness of, for example, about 100 Å to about 300 Å.

Cell bit lines 575 and a first capping layer pattern 580 are formed through a first portion of the insulating interlayer 570 in the cell area I. Additionally, a direct contact 576 and a second capping layer pattern 581 are formed through a second portion of the insulating interlayer 570 in the peripheral circuit area II. The cell bit lines 575 may make contact with the first impurity regions 565 of respective ones of the first transistors in the cell area I. The direct contact 576 may contact one of the second impurity regions 566 of the second transistor in the peripheral circuit area II.

In example embodiments, the cell bit line 575 and the direct contact 576 may each comprise a metal and/or a metal compound, and each of the first and the second capping layer patterns 580 and 581 may include nitride or oxynitride. For example, the cell bit line 575 and the direct contact 576 may be formed using tungsten, tungsten nitride, aluminum, aluminum nitride, titanium, titanium nitride, tantalum, tantalum nitride, etc. These may be used alone or in a combination thereof. Each of the first and the second capping layer patterns 580 and 581 may be formed using, for example, silicon nitride or silicon oxynitride.

Figure 27:
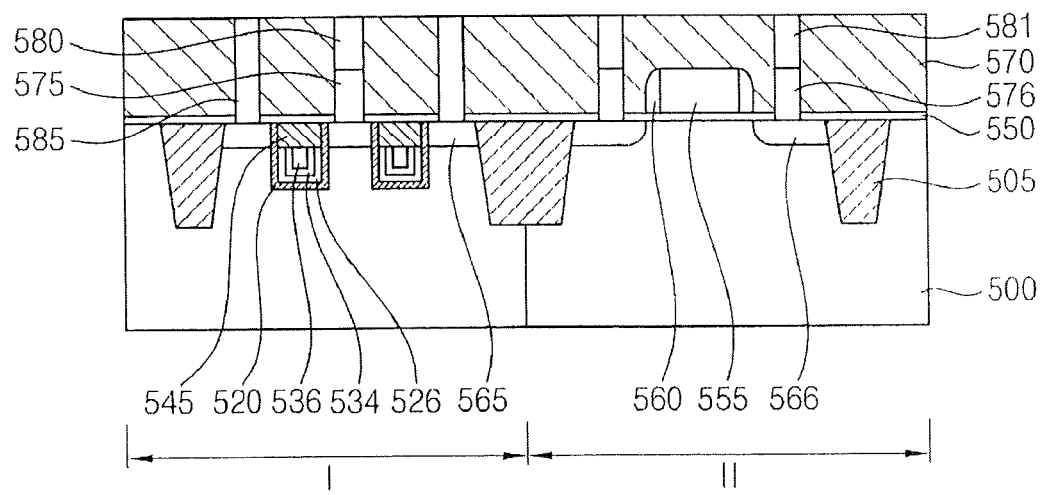

Referring to FIG. 27, pads 585 for capacitors are formed through a portion of the insulating interlayer 570 in the cell area I. The pads 585 may be adjacent to the cell bit lines 575 and may make contact with respective ones of the first impurity regions 565. The pads 585 may include polysilicon, metal and/or metal compound. For example, the pads 585 may be formed using polysilicon doped with impurities, tungsten, tungsten nitride, aluminum, aluminum nitride, titanium, titanium nitride, tantalum, tantalum nitride, etc. These may be used alone or in a combination thereof. The pads 585 may be formed, for example, by a sputtering process, a CVD process, a PECVD process, an ALD process, an evaporation process, etc.

Figure 28:
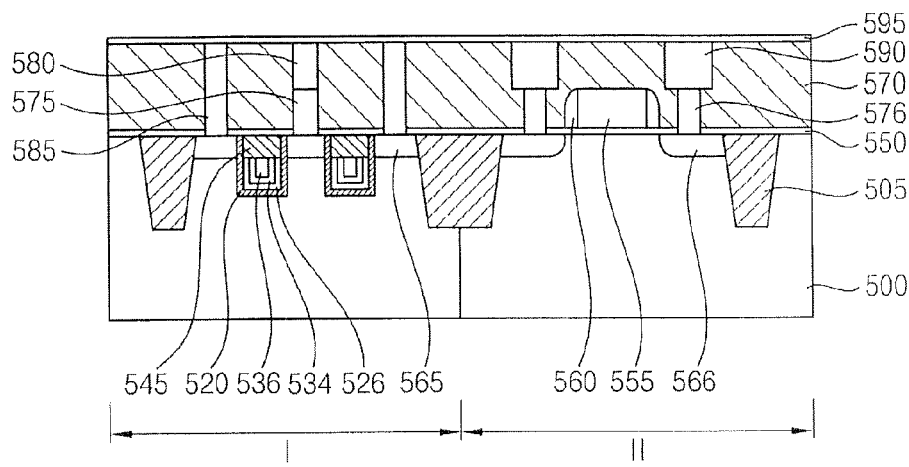

Referring to FIG. 28, a peripheral circuit bit line 590 is formed in the insulating interlayer 570 in the peripheral circuit area II. The peripheral circuit bit line 590 may include metal and/or metal compound. For example, peripheral circuit bit line 590 may be formed using tungsten, tungsten nitride, aluminum, aluminum nitride, titanium, titanium nitride, tantalum, tantalum nitride, etc. These may be used alone or in a combination thereof.

In example embodiments, the peripheral circuit bit line 590 is formed on the direct contact 576 after removing the second capping layer pattern 581. The peripheral circuit bit line 590 may have a width that is substantially larger than a width of the direct contact 576. When the peripheral circuit bit line 590 has a resistance substantially lower than the resistance of the cell bit lines 575, the peripheral circuit bit line 590 may include copper (Cu), platinum (Pt), silver (Ag), etc. In some embodiments, the peripheral circuit bit line 590 may have a multi layer structure to ensure a low resistance thereof.

An additional etch stop layer 595 is formed on the insulating interlayer 570, the first capping layer pattern 580 and the peripheral circuit bit line 590. The additional etch stop layer 595 may be formed using a material having an etching selectivity relative to the insulating interlayer 570. For example, the additional etch stop layer 595 may be formed using silicon nitride or silicon oxynitride by a CVD process, a PECVD process, an LPCVD process, etc.

Figure 29:
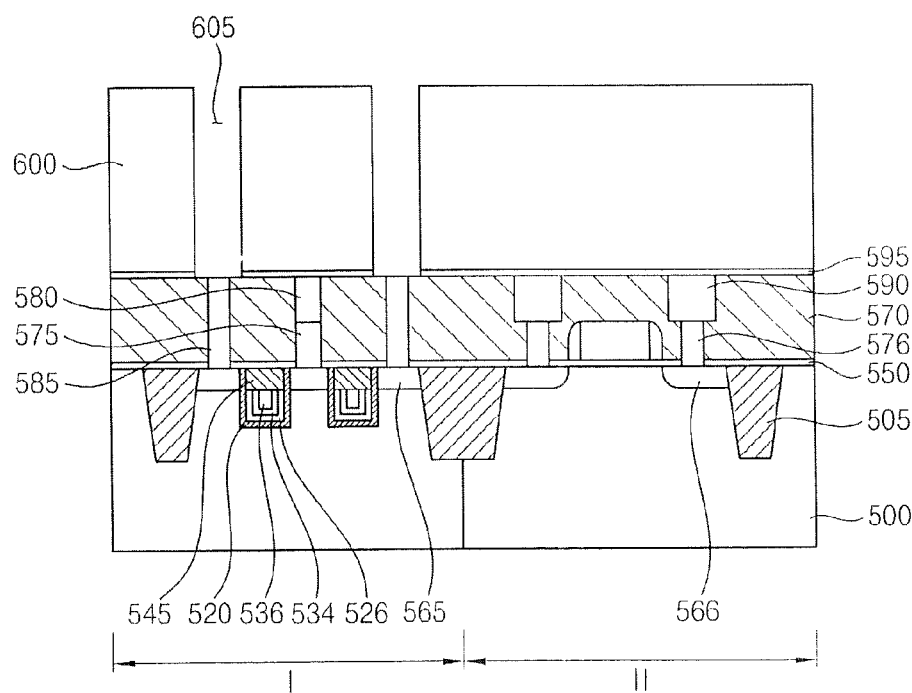

Referring to FIG. 29, a mold layer 600 is formed on the additional etch stop layer 595. The mold layer 600 may be formed using an oxide like silicon oxide by a CVD process, a PECVD process, an HDP-CVD process, etc. The mold layer 600 may include TEOS, PE-TEOS, BPSG, PSG, FOX, HDP-CVD oxide, etc. The mold layer 600 may have a relatively large thickness of about 10,000 Å to about 20,000 Å. However, the thickness of the mold layer 600 may be adjusted in accordance with a desired capacitance of a capacitor.

In some example embodiments, the mold layer 600 may have a multi-layer structure that includes a plurality of oxide films. The oxide films may have different etching rates.

In example embodiments, the mold layer 600 may include oxide that is substantially the same as or substantially similar to an oxide that is used to form the insulating interlayer 570. Alternatively, the mold layer 600 may be formed using an oxide that is different from the material used to form the insulating interlayer 570.

The mold layer 600 and the additional etch stop layer 595 are partially etched to form an opening 605 that exposes the pad 585 buried in the insulating interlayer 570. The opening 600 may be formed, for example, by an anisotropic etching process.

Figure 30:
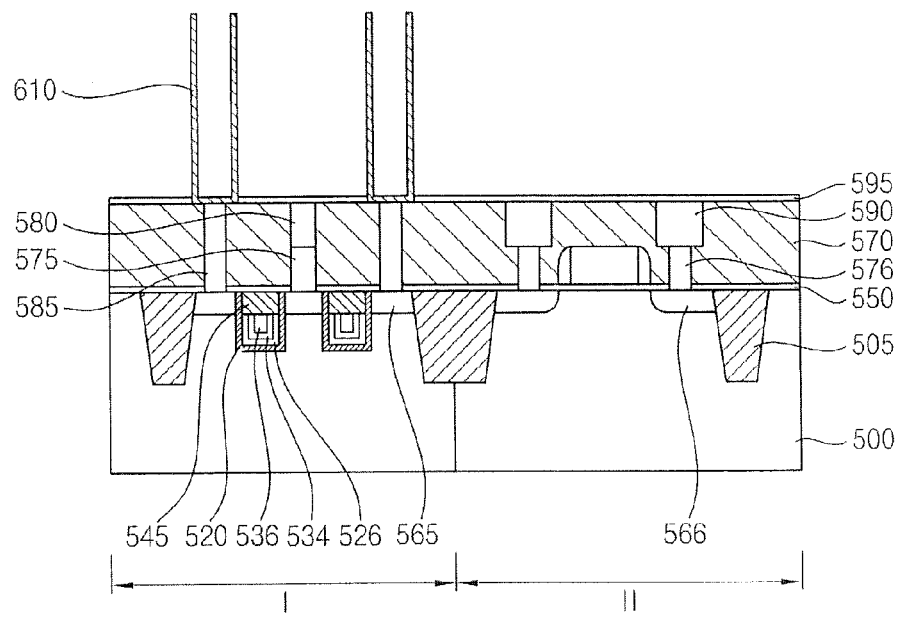

Referring to FIG. 30, a lower electrode 610 is formed on the plug 585 and on a sidewall of the opening 605. The lower electrode 610 may comprise, for example, a metal and/or a metal compound. For example, the lower electrode 610 may be formed using titanium, tantalum, aluminum, platinum, iridium, titanium nitride, aluminum nitride, tantalum nitride, etc. These may be used alone or in a combination thereof.

In example embodiments, a lower electrode layer (not illustrated) may be conformally formed on the plug 585, the sidewall of the opening 605 and the mold layer 600. The lower electrode layer may be formed by a CVD process, an ALD process, a sputtering process, a PLD process, etc. The lower electrode layer may be partially removed until the mold layer 600 is exposed, so that the lower electrode 610 may be formed in the opening 605. The lower electrode 610 may have a cylindrical structure and may have a circular cross section, a polygonal cross section, an elliptical cross section, etc.

After forming the lower electrode 610 on the plug 585, the mold layer 600 is removed from the lower electrode 610 and the additional etch stop layer 595. The mold layer 600 may be etched by a lift off process using a LAL solution when the mold layer 600 includes oxide.

In some example embodiments, a sacrificial layer (not illustrated) may be formed to cover an inside of the lower electrode 610, such that the sacrificial layer may prevent the lower electrode 610 from being damaged during the processes for forming the lower electrode 610 and for removing the mold layer 600. The sacrificial layer may include an oxide such as silicon oxide.

In some example embodiments, a supporting member (not illustrated) may be formed to enclose the lower electrode 610. The supporting member may improve a structural stability of the lower electrode 610, so that the lower electrode 610 may not fall down or lean over. The supporting member may be formed using a nitride such as silicon nitride, or an oxynitride like silicon oxynitride.

Figure 31:
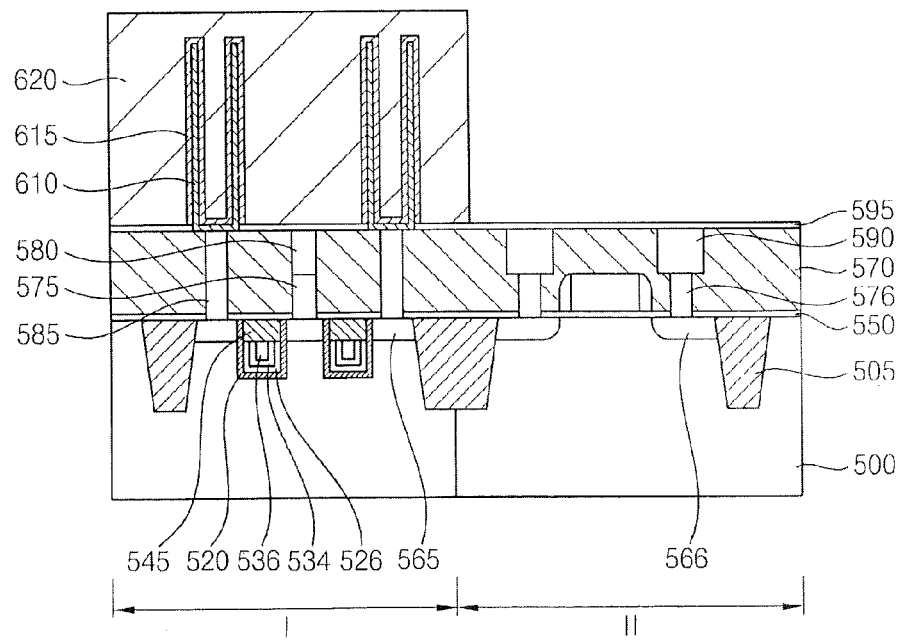

Referring to FIG. 31, a dielectric layer 615 is formed on the lower electrode 610, and then an upper electrode 620 is formed on the dielectric layer 615. The dielectric layer 615 may be formed using, for example, a metal oxide having a high dielectric constant. For example, the dielectric layer 615 may include zirconium oxide, hafnium oxide, tantalum oxide, aluminum oxide, titanium oxide, etc. These may be used alone or in a mixture thereof. Further, the dielectric layer 615 may be obtained by an ALD process, a CVD process, a PECVD process, a sputtering process, etc.

In example embodiments, the dielectric layer 615 may have a multilayer structure that includes a plurality of metal oxide films that may be formed by ALD processes. When the dielectric layer 615 includes zirconium oxide, the dielectric layer 615 may include a plurality of zirconium oxide films formed by several ALD processes. In such embodiments, each of the zirconium oxide films may have a thickness of about 100 Å to about 200 Å. Alternatively, the dielectric layer 615 may have other multi-layer structures such as a zirconium oxide film/an aluminum oxide film/a zirconium oxide film (ZAZ), a zirconium oxide film/an aluminum oxide film/a tantalum oxide film (ZAT), etc.

The upper electrode 620 is formed on the dielectric layer 615 to sufficiently cover a gap between adjacent lower electrodes 610. The upper electrode 620 may be formed using a metal and/or a metal compound by an ALD process, a CVD process, a PECVD process, a sputtering process, etc. For example, the upper electrode 620 may include titanium, tantalum, aluminum, platinum, iridium, titanium nitride, aluminum nitride, tantalum nitride, etc. These may be used alone or in a combination thereof.

Figure 32:
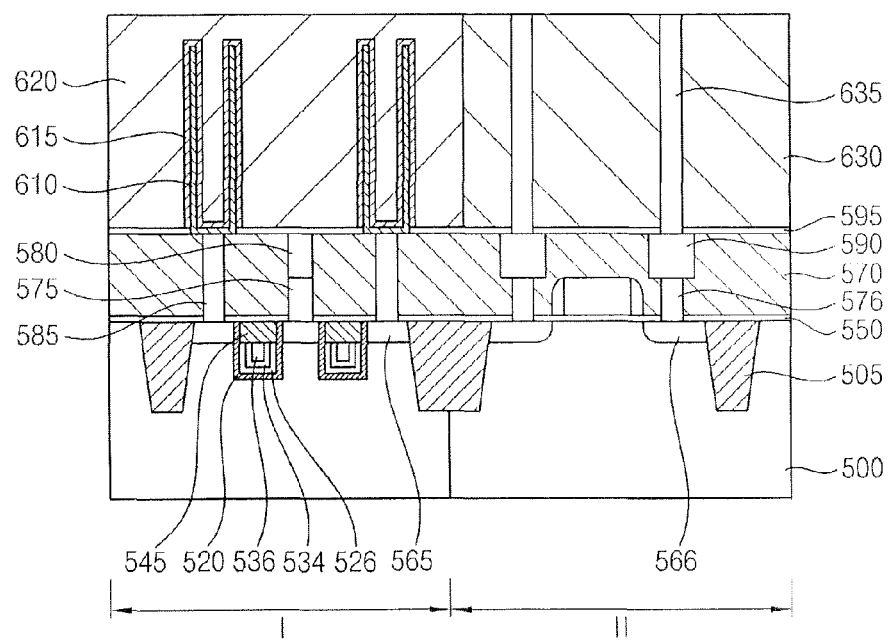

Referring to FIG. 32, an insulation layer 630 is formed on a portion of the additional etch stop layer 595 in the peripheral circuit area II. The insulation layer 630 may be formed using oxide by a CVD process, a PECVD process, an HDP-CVD process, etc. The insulation layer 630 may have a flat surface through a planarization process such as a CMP process and/or an etch-back process.

In example embodiments, the surface of the insulation layer 630 and a surface of the upper electrode 620 may be located on the same plane. Namely, the insulation layer 630 may have a height substantially the same as or substantially similar to that of the upper electrode 620. Therefore, a step may not be generated between the cell area I and the peripheral circuit area II.

A wiring 635 is formed through the insulation layer 630 after partially etching the insulation layer 630 and the additional etch stop layer 595. The wiring 635 may make contact with the peripheral circuit bit line 590. The wiring 635 may be formed using metal and/or a metal compound.

In some example embodiments, a protection layer (not illustrated) may be formed on the upper electrode 620 to protect the upper electrode 620 while forming the wiring 635 through the insulation layer 630 and the additional etch stop layer 595. The protection layer may be formed using an organic material, oxide, nitride, oxynitride, etc.

Figure 33:
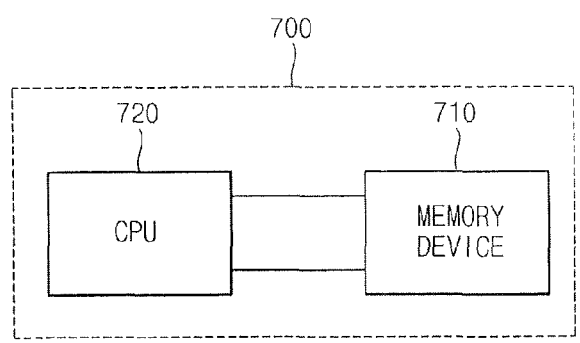
FIG. 33 is a block diagram illustrating a memory system in accordance with example embodiments.

FIG. 33 is a block diagram illustrating still another memory system in accordance with example embodiments.

Referring to FIG. 33, the memory system includes a memory device 710 and a central processing unit (CPU) 720 in a computer system 700. The memory device 710 may be electrically connected to the CPU 720. For example, the computer system 700 may include a personal computer, a personal data assistant, a notebook computer, etc. The memory device 710 may be directly connected to the CPU 720 or may be electrically connected to the CPU 720 through a bus. When the memory device 710 includes a transistor having the above-described buried gate structure, the memory device 710 may have improved characteristics such as a high response speed, a large integration degree, etc.

Figure 34:
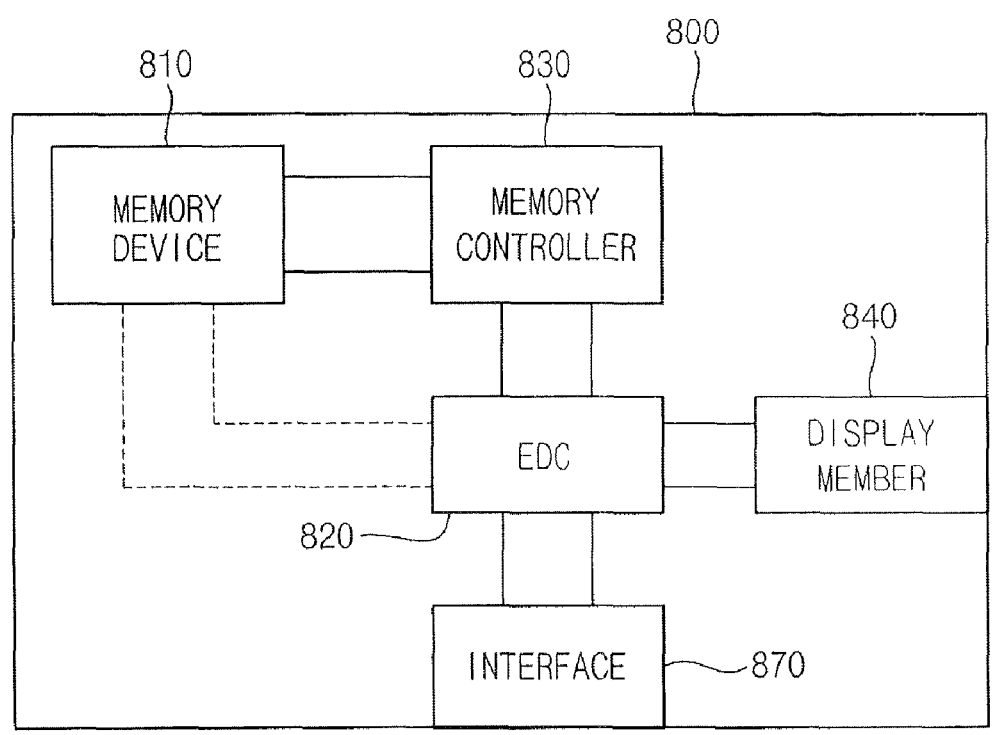
FIG. 34 is a block diagram illustrating another memory system in accordance with example embodiments.

FIG. 34 is a block diagram illustrating another memory system in accordance with example embodiments.

Referring to FIG, 34, the memory system is used in a portable electronic apparatus 800. The portable electronic apparatus 800 may include an MP3 player, a portable video player, a portable multimedia player, a digital camera, etc. The memory system in the portable electronic apparatus 800 includes a memory device 810 and a memory controller 830. Further, the memory system includes an encoder/decoder (EDC) 820, a display member 840 and an interface 870. The memory device 810 may include a transistor having the above-described buried gate structure. Here, the buried gate structure may be obtained through the above-described processes.

The EDC 820 may input/output data such as audio data or video data into/from the memory device 810 through the memory controller 830. Alternatively, the data may be directly inputted from the EDC 820 into the memory device 810 or may be directly outputted from the memory device 810 into the EDC 820. The EDC 820 may encode the data stored in the memory device 810. For example, the EDC 820 may encode MP3 files to store the audio data into the memory device 810. Alternatively, the EDC 820 may encode MPEG files to store the video data into the memory device 810. Further, the EDC 820 may include a compound encoder for encoding different file types of various data, For example, the EDC 820 may include an MP3 encoder for the audio data and an MPEG encoder for the video data.

The EDC 820 may decode the data from the memory device 810. For example, the EDC 820 may perform decoding of the MP3 files based on the audio data stored in the memory device 810. Alternatively, the EDC 820 may execute decoding of MPEG files from the video data stored in the memory device 810. Thus, the EDC 820 may include an MP3 decoder for the audio data and an MPEG decoder for the video data.

In example embodiments, the EDC 820 may include a decoder without an encoder. For example, encoded data may be input into the EDC 820, and then the encoded data may be directly stored into the memory device 810 or may be stored into the memory device 810 through the memory controller 830 when the EDC 820 has the decoder only.

The EDC 820 may receive data for encoding or encoded data through the interface 870. The interface 870 may meet a predetermined reference such as a fire wire or a USB. For example, the interface 870 may include a fire wire interface or a USB interface. Further, the data stored in the memory device 810 may be output through the interface 870. The display member 840 may display the data outputted from the memory device 810 or the decorded data from the EDC 820. For example, the display member 840 may include a speaker jack to output the audio data and/or a display screen to display the video data.

According to example embodiments, a conductive layer pattern of a buried gate structure may have a desired specific resistance since the conductive layer pattern may be grown from a nucleation layer after changing a crystalline structure of the nucleation layer by a thermal treatment process. Thus, the buried gate structure including the conductive layer pattern may also have a low resistance. When the buried gate structure is employed in a semiconductor device, electrical and operational characteristics of the semiconductor device may be improved even though the semiconductor device has a fine design rule below about 20 nm.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The invention is defined by the following claims, with equivalents of the claims to be included therein.

What is claimed is:

1. A method of manufacturing a semiconductor device, comprising:
    forming a first recess in a substrate;
    forming a gate insulation layer in the first recess;
    forming a barrier layer on the gate insulation layer;
    forming a preliminary nucleation layer having a first resistance on the barrier layer;
    changing the preliminary nucleation layer to a nucleation layer having a second resistance that is less than the first resistance;
    forming a conductive layer on the nucleation layer; and
    partially etching the conductive layer, the nucleation layer, the barrier layer and the gate insulation layer to form a buried gate structure including a gate insulation layer pattern, a barrier layer pattern, a nucleation layer pattern and a conductive layer pattern,
    wherein the preliminary nucleation layer includes tungsten having a $\beta$ crystalline phase and the nucleation layer includes tungsten having an $\alpha$ crystalline phase.

2. The method of claim 1, wherein the barrier layer is formed using at least one of metal and metal compound.

3. The method of claim 1, further comprising:
    forming an isolation layer on the substrate to define an active region of the substrate;
    forming an impurity region at a portion of the active region adjacent to the buried gate structure;
    forming an insulating interlayer on the substrate to cover the buried gate structure; and
    forming a capacitor on the insulating interlayer, the capacitor being electrically connected to the impurity region.

4. The method of claim 1, wherein the conductive layer includes tungsten having an $\alpha$ crystalline phase.

5. The method of claim 1, wherein the nucleation layer is formed by treating the preliminary nucleation layer at a temperature of between about 700° C. to about 1,500° C.

6. The method of claim 1, wherein impurities in the preliminary nucleation layer are removed by thermally treating the preliminary nucleation layer to form the nucleation layer.

7. The method of claim 1, wherein the nucleation layer is formed by thermally treating the preliminary nucleation layer.

8. The method of claim 7, wherein the preliminary nucleation layer is formed using a first apparatus and the nucleation layer is formed using a second apparatus.

9. The method of claim 7, wherein the preliminary nucleation layer and the nucleation layer are formed in-situ using a single apparatus.

10. The method of claim 7, wherein the nucleation layer is formed by performing a rapid thermal annealing process, a spike rapid thermal annealing process, a flash rapid thermal annealing process, a laser annealing process or a millisecond annealing process on the preliminary nucleation layer.

11. The method of claim 1, wherein partially etching the conductive layer, the nucleation layer, the barrier layer and the gate insulation layer further comprises:
    etching portions of the gate insulation layer, the barrier layer, the nucleation layer and the conductive layer to expose the substrate to form the gate insulation layer pattern on a bottom and a sidewall of the first recess; and
    etching portions of the barrier layer, the nucleation layer and the conductive layer to form the barrier layer pattern, the nucleation layer pattern and the conductive layer pattern on the gate insulation layer pattern,
    wherein a second recess is generated on the buried gate structure.

12. The method of claim 11, wherein forming the buried gate structure further comprises forming a gate mask on the barrier layer pattern, the nucleation layer pattern and the conductive layer pattern to fill the second recess.

* * * * *